(12) United States Patent
Grieco et al.

(10) Patent No.: US 11,971,589 B2
(45) Date of Patent: Apr. 30, 2024

(54) PHOTONIC BEAM STEERING AND APPLICATIONS FOR OPTICAL COMMUNICATIONS

(71) Applicant: The Regents of the University of California, Oakland, CA (US)

(72) Inventors: Andrew Grieco, La Jolla, CA (US); Abdelkrim El Amili, La Jolla, CA (US); Yeshaiahu Fainman, La Jolla, CA (US); Stephen Pappert, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 134 days.

(21) Appl. No.: 17/037,502

(22) Filed: Sep. 29, 2020

(65) Prior Publication Data

US 2021/0116655 A1 Apr. 22, 2021

Related U.S. Application Data

(63) Continuation-in-part of application No. PCT/US2019/025240, filed on Apr. 1, 2019.

(60) Provisional application No. 62/651,025, filed on Mar. 30, 2018.

(51) Int. Cl.
*G02B 6/42* (2006.01)
*G02B 6/293* (2006.01)
*H01S 5/00* (2006.01)

(52) U.S. Cl.
CPC ....... *G02B 6/4215* (2013.01); *G02B 6/29343* (2013.01); *H01S 5/0071* (2013.01)

(58) Field of Classification Search
CPC .. G02B 6/4215; G02B 6/29343; H01S 5/0071
See application file for complete search history.

(56) References Cited

U.S. PATENT DOCUMENTS

| | | | |
|---|---|---|---|
| 5,966,399 A | 10/1999 | Jiang et al. | |
| 6,169,295 B1 | 1/2001 | Koo | |
| 8,301,027 B2 | 10/2012 | Shaw et al. | |
| 8,400,494 B2 * | 3/2013 | Zalevsky | H10B 41/35 348/46 |
| 9,482,796 B2 * | 11/2016 | Arbabi | G02B 5/1842 |
| 9,632,317 B2 | 4/2017 | Martinez | |
| 9,946,070 B2 * | 4/2018 | Tam | H04N 13/156 |
| 9,989,680 B2 * | 6/2018 | Arbabi | G02B 5/1842 |
| 10,591,643 B2 * | 3/2020 | Lin | G02B 21/367 |
| 10,670,782 B2 * | 6/2020 | Arbabi | G02B 5/1876 |

(Continued)

OTHER PUBLICATIONS

Karlton Crabtree, and Ignacio Moreno, "Programmable birefringent lenses with a liquid crystal display," Appl. Opt. 43, 6235-6241 (2004) (Year: 2004).*

(Continued)

*Primary Examiner* — Peter Radkowski
(74) *Attorney, Agent, or Firm* — Perkins Coie LLP

(57) ABSTRACT

The technology described in this document can be used to implement beam steering in optical systems and photonic devices, to provide a nonmechanical beam steering system for projecting optical energy and controlling the direction of the optical energy using a collection of devices and components that are fixed in position to selectively direct light from an array of different optical emitters at different locations.

20 Claims, 20 Drawing Sheets

(56) References Cited

U.S. PATENT DOCUMENTS

| | | | |
|---|---|---|---|
| 10,725,290 B2* | 7/2020 | Fan | G02B 27/0012 |
| 10,816,704 B2* | 10/2020 | Arbabi | G02B 5/1828 |
| 11,644,669 B2* | 5/2023 | Yeoh | G02B 27/0172 |
| | | | 345/8 |
| 2002/0196816 A1* | 12/2002 | Shirasaki | H01S 3/08059 |
| | | | 372/20 |
| 2010/0177164 A1* | 7/2010 | Zalevsky | H04N 13/20 |
| | | | 348/46 |
| 2014/0192394 A1* | 7/2014 | Sun | G02F 1/0147 |
| | | | 359/238 |
| 2015/0219806 A1* | 8/2015 | Arbabi | G02B 5/1842 |
| | | | 29/436 |
| 2017/0045652 A1* | 2/2017 | Arbabi | G02B 5/1828 |
| 2017/0146806 A1* | 5/2017 | Lin | G02B 3/0062 |
| 2017/0212285 A1* | 7/2017 | Arbabi | G02B 1/002 |
| 2017/0261746 A1* | 9/2017 | Tam | H04N 13/332 |
| 2018/0045953 A1* | 2/2018 | Fan | G02B 1/002 |
| 2018/0275410 A1* | 9/2018 | Yeoh | H04N 13/395 |
| 2018/0299595 A1* | 10/2018 | Arbabi | G02B 5/1847 |

OTHER PUBLICATIONS

R. S. Eng and K. G. Leib, "Multiple Imagery with Birefringent Lenses," Appl. Opt. 8, 2117-2120 (1969) (Year: 1969).*

Burrows, et al., Achieving full-color organic light-emitting devices for lightweight, flat-panel displays, in IEEE Transactions on Electron Devices, vol. 44, No. 8, pp. 1188-1203, Aug. 1997, doi: 10.1109/16.605453. (Year: 1997).*

Shen et al. Three-Color, Tunable, Organic Light-Emitting Devices. Science 276, 2009-2011(1997). DOI:10.1126/science.276.5321. 2009 (Year: 1997).*

Jiang, Zhenyu, Light Emitting Diodes and Photodetectors Based on III-Nitride and Colloidal Quantum Dot Materials, the Pennsylvania State University, Dissertation, 2014 (Year: 2014).*

Palacios-Berraquero et al., Large-scale quantum-emitter arrays in atomically thin semiconductors. Nat Commun 8, 15093 (2017). https://doi.org/10.1038/ncomms15093 (Year: 2017).*

Wei et al., Emission characteristics of organic light-emitting diodes and organic thin-films with planar and corrugated structures. Int J Mol Sci. Apr. 12, 2010;11(4):1527-45. doi: 10.3390/ijms11041527. PMID: 20480033; PMCID: PMC2871129. (Year: 2010).*

Kodigala, A., Lepetit, T., Gu, Q et al. Lasing action from photonic bound states in continuum. Nature 541, 196-199 (2017). https://doi.org/10.1038/nature20799 (Year: 2017).*

Smalley, J., Vallini, F., Montoya, S. et al. Luminescent hyperbolic metasurfaces. Nat Commun 8, 13793 (2017). https://doi.org/10.1038/ncomms13793 (Year: 2017).*

Inoue et al., Demonstration of a new optical scanner using silicon photonics integrated circuit, Opt. Express 27, 2499-2508 (2019) (Year: 2019).*

Doylend et al., Two-dimensional free-space beam steering with an optical phased array on silicon-on-insulator, Opt. Express 19, 21595-21604 (2011) (Year: 2011).*

Hsu et al. Bound states in the continuum. Nat Rev Mater 1, 16048 (2016). https://doi.org/10.1038/natrevmats.2016.48 (Year: 2016).*

Arbabi et al., Multiwavelength polarization-insensitive lenses based on dielectric metasurfaces with meta-molecules, Optica 3, 628-633 (2016) (Year: 2016).*

ISA, International Search Report and Written Opinion of International Application No. PCT/US2019/025240. dated Aug. 19, 2019. 12 pages.

Inoue, D. et al. "Demonstration of a new optical scanner using silicon photonics integrated circuit" Optics Express, Feb. 2019, vol. 27, No. 3. 2499-2508.

* cited by examiner

PHOTONIC BEAM STEERING AND APPLICATIONS FOR OPTICAL COMMUNICATIONS

PRIORITY CLAIMS AND RELATED PATENT APPLICATIONS

This application is a continuation-in-part of International Patent Application No. PCT/US2019/025240 entitled "PHOTONIC BEAM STEERING AND APPLICATIONS FOR OPTICAL COMMUNICATIONS," filed on Apr. 1, 2019, which claims the priority and benefits of U.S. Provisional Application No. 62/651,025 entitled "Photonic Beam Steering and Applications in Wavelength-Division Multiplexed (WDM) Free-Space Transceivers for Optical Communications" and filed on Mar. 30, 2018. The entire contents of the above applications are incorporated by reference as part of the disclosure of this patent document.

TECHNICAL FIELD

The technology disclosed in this patent document relates to beam steering in optical systems and photonic devices.

BACKGROUND

Steering of one or more optical beams is an important operation in many optical devices or systems and various beam steering mechanism are based on a physical or mechanical motion of an optical element, such as one or more mirrors, lenses, prisms, or a combination of different optical elements, to change the direction of an optical beam. Such beam steering designs tend to be bulky, are subject to tear and wear due to the motion between different components over time and are prone to reliability issues.

SUMMARY

The technology disclosed in this patent document relates to beam steering in optical systems and photonic devices.

In one aspect, for example, the disclosed technology can be implemented to provide a device including an array of light emitters located at different locations, each light emitter operable to produce an optical beam that is associated with a location of the light emitter and is different from another optical beam produced by another light emitter due to the location of the light emitter being different from a location of another light emitter, an optical projection device located at a fixed position relative to the array of light emitters in optical paths of the optical beams from the array of light emitters, the optical projection device operable to direct each optical beam to a particular beam direction that is associated with a location of each light emitter relative to the optical projection device and is different from any other beam directions, the optical projection device structured to include no moving part, and a control circuit coupled to the array of light emitters and operable to turn on or off the light emitters to project one or more optical beams from the light emitters to the optical projection device which in turn directs the received one or more optical beams to corresponding one or more particular beam directions, wherein the control circuit is operable to selectively turn on and off different laser diodes to project the different optical beams from the selected laser diodes to form a desired beam scanning pattern to effectuate an effect of scanning a single optical beam in different beam directions.

In another aspect, for example, the disclosed technology can be implemented to provide an optical transceiver device including an array of light emitters located at different locations, each light emitter operable to produce an optical beam that is associated with a location of the light emitter and is different from another optical beam produced by another light emitter due to the location of the light emitter being different from a location of another light emitter, an array of optical detectors that are distributed amongst the array of light emitters for detecting light, an optical projection device located at a fixed position relative to the array of light emitters in optical paths of the optical beams from the array of light emitters, the optical projection device operable to direct each optical beam to a particular beam direction that is associated with a location of each light emitter relative to the optical projection device and is different any other beam directions, the optical projection device operable to collect received light and directs the received light onto the optical detectors distributed amongst the array of light emitters for detecting light, the optical projection device structured to include no moving part, and a control circuit coupled to the array of light emitters and operable to turn on or off the light emitters to project one or more optical beams from the light emitters to the optical projection device which in turn directs the received one or more optical beams to corresponding one or more particular beam directions, wherein the control circuit is operable to selectively turn on and off different laser diodes to project the different optical beams from the selected laser diodes to form a desired beam scanning pattern to effectuate an effect of scanning a single optical beam in different beam directions.

In another aspect, for example, the disclosed technology can be implemented to provide a beam steering system including a light emission device including a light source array and a light source selector coupled to the light source array, the light source array including a plurality of light sources arranged in rows and columns, the light source selector being structured to select one or more light sources from the light source array to produce one or more optical beam, an optical device located at a fixed position relative to the light emission device in optical paths of the one or more optical beams from the light emission device such that, from the one or more selected optical beams, a collimated beam is produced at different angle depending on the location of incident light on the optical device, and a control circuit coupled to the light source selector of the light emission device to select the one or more light sources from the light source array based on address information indicative of the location of the light source associated with the location of incident light on the optical device.

In another aspect, for example, the disclosed technology can be implemented to provide a light emission device including a light source structured to generate a light beam and a light path selector coupled to the light source and configured to provide a plurality of light paths to direct the light beam generated by the light source to a desired location, an optical device located at a fixed position relative to the light emission device in optical paths of the one or more optical beams from the light emission device such that, from the one or more selected optical beams, a collimated beam is produced at different angle depending on the location of incident light on the optical device, and a control circuit coupled to the light source selector of the light emission device to select the one or more light sources from the light source array based on address information indicative of the location of the light source associated with the location of incident light on the optical device.

DETAILED DESCRIPTION

Figure 1A:
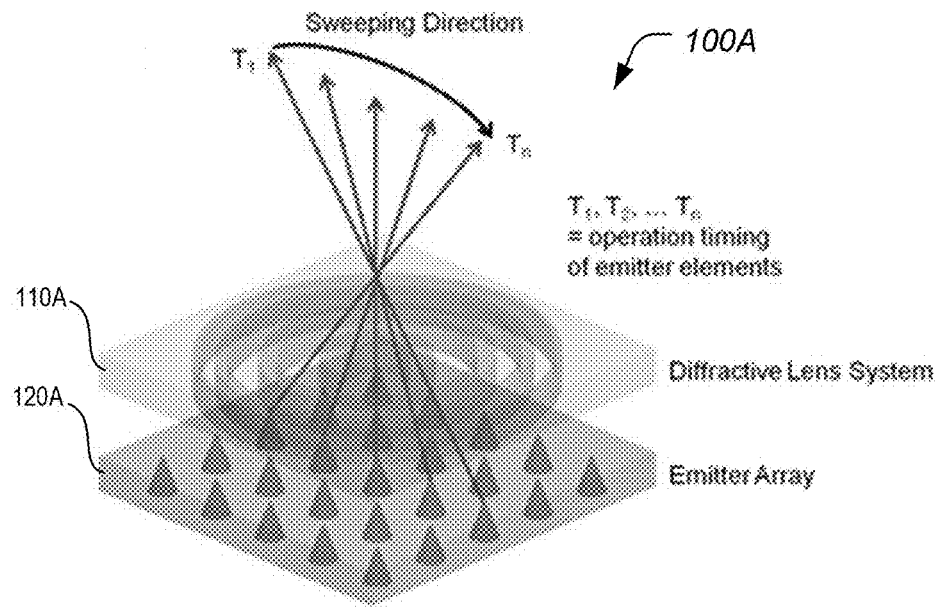
FIG. 1A shows an example of the beam steering system where angular steering is performed by sequential activation of the individual emitter elements such that the emitted radiation is collimated in each direction by the diffractive lens system.

Disclosed are devices, systems and methods for beam steering in optical systems and photonic devices. In some applications, the disclosed technology may be used to implement a full duplex transceiver on a chip for free space optical communications (FSOC) systems exploiting Si-photonics manufacturing.

The photonic beam steering disclosed in this patent document is based on a nonmechanical beam steering system for projecting optical energy and controlling the direction of the optical energy using a collection of devices and components that are fixed in position to selectively direct light from an array of different optical emitters at different locations. For example, a planar imaging system may be combined with a uniform array of nanoscale optical emitters in one focal plane to allow for selective activation of an individual emitter to send out a collimated beam at an angle that depends on the position of the emitter within the focal plane. Successive activation of emitters can thus be used to direct the beam across the entire aperture of the imaging system, effectively steering the optical beam.

The disclosed photonic beam steering can be used to construct a device that includes an array of light sources located at different locations and each light source is operable to produce an optical beam that is associated with a location of the light source and is different from another optical beam produced by another light source due to the location of the light source being different from a location of another light source. An optical projection device is located at a fixed position relative to the array of light sources in optical paths of the optical beams from the array of light sources, the optical projection device operable to direct each optical beam to a particular beam direction that is associated with a location of each light source relative to the optical projection device and is different any other beam directions, the optical projection device structured to include no moving part. A control circuit is coupled to the array of light sources and operable to turn on or off the light sources to project one or more optical beams from the light sources to the optical projection device which in turn directs the received one or more optical beams to corresponding one or more particular beam directions. The control circuit is operable to selectively turn on and off different laser diodes to project the different optical beams from the selected laser diodes to form a desired beam scanning pattern to effectuate an effect of scanning a single optical beam in different beam directions.

The disclosed beam steering can be used in a wide range of applications such as free space communications, RF photonics, LIDAR, etc. that requires changing a beam's direction. There are numerous applications that would benefit from integration with this technology. They include LIDAR, RF photonics, medical imaging such as optical coherence tomography, and endoscopy, optical communications, optical networking, spatial multiplexing, switching, ranging and collision detection, and sensing. The input waveguide of this design is ideal for integration with devices for optical signal preprocessing (e.g. modulators for LIDAR and communications, filters for sensing, etc.) which can even be integrated on the same chip. In the same vein, the collection waveguide is ideal for optical signal postprocessing. This is of increasing relevance given the proliferation of advanced modulation schemes (e.g. phase shift keying, quadrature amplitude modulation, etc.) that rely on postprocessing techniques to compensate for noise and improve the bit error rate. For example, some designs of free-space communication systems may project optical energy of high power laser sources by using mechanical components, moving parts, and bulk optics and tend to be limited by their size, weight, reliability and cost. The disclosed beam steering can be used to provide a novel non-mechanical beam steering approach that lends itself to miniaturization as well as high power ultra-wideband operation.

The disclosed technology uses an array of laser emitters located at different positions without requiring coherence of the different laser emitters as in some phased array designs and, in some implementations, selects one single emitter from the array of different laser emitters to be active to output a laser beam at a desired direction at a particular time and different laser emitters can be activated to direction output beams at different locations. In some applications, the disclosed beam steering can be used to provide beam steering operation at multiple wavelengths through the use of broadband emitters. Likewise, simultaneous multi-beam, multi-spectral operation can be realized with our highly flexible approach. Compared to other beam steering approaches, the disclosed technology can be used to achieve one or more advantages, including, e.g., reduced size and weight, relaxed coherence requirements, improved robustness and reliability, or superior operating efficiency. For example, the disclosed technology can be implemented to provide an integrated, scalable, compact, non-mechanical broadband beam steering system for numerous free space optical systems applications.

In some implementations, the laser beam may be modulated to carry information to be transmitted outside the device. The device may further include one or more transmission components for signal collection and processing of collected signals.

The disclosed technology can be used to implement a birefringent planar optical system combined with a uniform array of interspersed nanoscale optical emitters and detectors in one focal plane, with transmission and reception occurring simultaneously on orthogonally polarized beams, thus allowing full duplex operation. Various embodiments of the disclosed technology may enable low cost, size, weight and power (CSWaP) FSOC systems that can operate with multiple WDM channels supporting various modulation and coding protocols operating in full duplex mode.

Figure 1B:
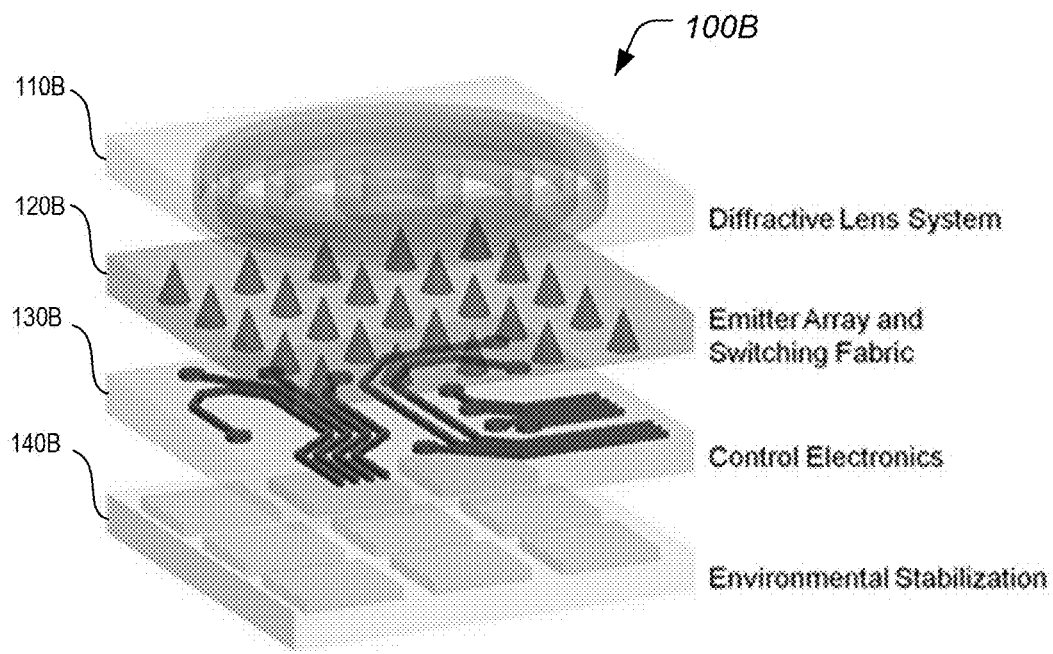
FIG. 1B shows an example configuration of the beam steering system including unit cell subsystems.

FIG. 1A shows an example of the beam steering system where angular steering is performed by sequential activation of the individual emitter elements such that the emitted radiation is collimated in each direction by the diffractive lens system. FIG. 1B shows an example configuration of the beam steering system including unit cell subsystems.

The beam steering system 100A implemented based on an embodiment of the disclosed technology may include an emitter array 120A of different light emitters to produce light beams and an optical module 110A for redirecting the light beams from the emitter array 120A. The optical module 110A can be implemented as an optical imaging module or a diffractive optical element such as a diffractive lens system. In an implementation, the beam steering system 100A may include one or more unit cells, each of which includes a plurality of discrete layers. For example, as illustrated in FIG. 1B, a beam steering system 100B includes an imaging system 110B, an emitter array 120B, and control electronics 130B. The emitter array 120B is configured to emit light towards the imaging system 110B under control of the control electronics 130B. The imaging system 110A, 110B may be a planar imaging system with an optical projection device for directing output optical beams out in directions, and the emitter array 120A, 120B may be an optical emitter layer having the array of light emitters or light sources. For example, the imaging system 110A, 110B may include a planar imaging system combined with a uniform array of nanoscale optical emitters in one focal plane, and the emitter array 120A, 120B may include an array of light sources located at different locations and operable to produce an optical beam that is associated with a location of the light source. The emitter array 120A, 120B selectively activates an individual emitter element so that the imaging system 110A, 110B can send out a collimated beam at an angle that depends on the position of the emitter within the focal plane. The control electronics 130B may include an electrical control system for selecting and controlling the emitter array 120B such that one or more light emitters selected from the light emitters of the emitter array 120B. The control electronics 130B may include transistor logic gates and appropriate amplifiers to provide adequate voltage levels to the emitter array 120B. In another embodiment of the disclosed technology, the beam steering system 100B may further include an environmental stabilisation layer 140B. The imaging system 110A, 110B can be implemented to include diffractive lens elements as the optical projection device. The emitter array 120A, 120B may be implemented to include waveguides, optical switches (e.g., ring resonators), and vertical couplers. The emitter array 120 may include one or more laser sources coupled to waveguides to direct laser light to the different light emitters.

As illustrated in FIG. 1A, an input light beam (e.g., a laser beam) generated by an individual emitter element is directed through the diffractive lens system, and the resulting light radiation is collimated by the diffractive lens system. The direction of the collimated output beam is determined by the position of the activated emitter element in the array, and the beam may be steered by activating the desired sequence of emitters. This can be said an integrated chip-scale equivalent of a Rotman lens antenna. Although the diameter of a single unit cell will be limited by the available nanofabrication technology, multiple unit cells can be combined to form an aperture of any size.

Referring to FIG. 1B, each unit cell of the beam steering system 100B may include an imaging system 110B such as planar lens, an emitter array and associated photonic switching fabric 120B, control electronics 130B, and a stabilisation system 140B which will monitor and compensate for environmental temperature fluctuations.

The control electronics 130B may be configured to selectively turn on and off different laser diodes to project the different optical beams from the selected laser diodes to form a desired beam scanning pattern. In selectively activating one single emitter from the emitter array 120A, 120B, any selection scheme may be used, including, e.g., ring resonator optical switches, cross-bar switches, and multistage switching networks.

Figure 2A:
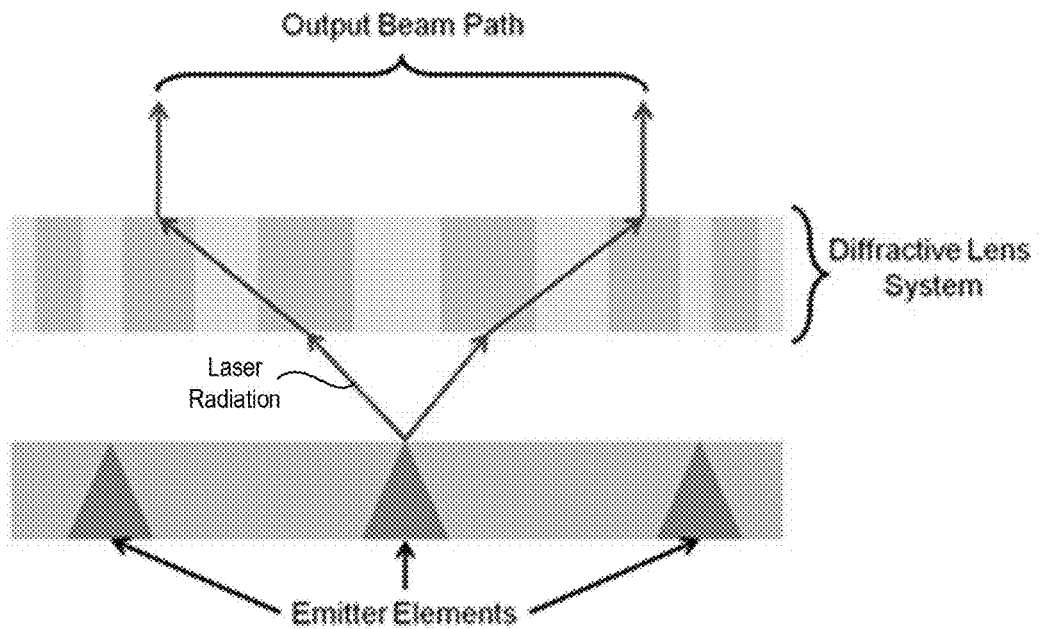
FIGS. 2A and 2B show a cross section of an optical beam steering device during light emission, including transmission of a collimated beam normal to the device plane (FIG. 2A), and transmission of a collimated beam at an angle to the device plane (FIG. 2B).
Figure 2B:
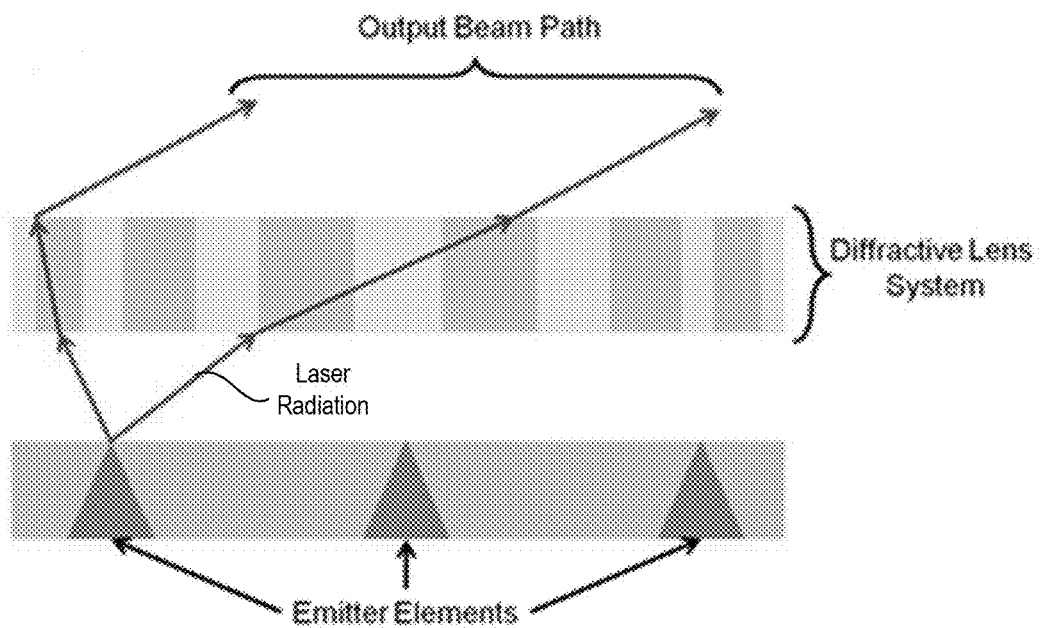

FIGS. 2A and 2B show a cross section of an optical beam steering device during light emission. Specifically, FIG. 2A illustrates transmission of a collimated beam from a particular emitter along a direction normal to the device plane of or along the optic axis of the diffractive lens system, and FIG. 2B illustrates transmission of a collimated beam from another emitter at a different location that is incident to the diffractive lens system at an angle and thus is directed by the diffractive lens system to a different direction. Accordingly, with a proper design of the diffractive lens system, light beams from different emitters at different locations can be directed to different directions. Selectively activating emitters at different locations allow the system to output a light beam at different beam directions and thus allows for beam steering.

The planar lens system is used to transmit a collimated beam as follows. To begin, laser radiation emanates from an emitter element. This radiation is collected by the planar lens system and formed into a collimated beam. The direction of the collimated beams will depend on the position of the emitter elements in relation to the optical axis of the lens.

The planar lens system is used to produce a collimated beam at a particular angle depending on the location of incident light on the planar lens system. Examples of the planar lens system include graded index Fresnel zone plates. Such diffractive lenses in general display more chromatic dispersion than conventional lenses. This feature can be exploited to enable operation at multiple wavelengths. Since the focal length of the lens will vary with wavelength, multiple emitter arrays can be vertically stacked, and simultaneously operated at wavelengths corresponding to the different focal planes. This enables the steering of multiple beams of different wavelengths independently. The emitters may also similarly be discriminated by polarization if the lens system is designed to be birefringent.

In some embodiments of the disclosed technology, the planar lens system may include a lenslet array consisting of a set of lenslets in the same plane. Each lenslet may have the same focal length, or, alternatively, some of the lenslets may have a different focal length from others.

The array of the light emitters can be implemented in various ways. Different optical wavelengths may be provided in the light emitters to allow for wavelength-division multiplexing in various implementations.

In some embodiments of the disclosed technology, the light emitters may include laser diodes or LEDs located at different locations forming the array. For example, the light emitters may be arranged in rows and columns to form the array such that, in the array, each light emitter location has its own address. In this way, each light emitter in the array may be activated according to address information.

In some other embodiments of the disclosed technology, the emitter subsystem (e.g., an emitter array) may use a shared architecture where one or more lasers are used to provide a "master" laser beam and a network of waveguides to distribute the master laser beam to different light emitter locations so that different optical beams can be produced at the different emitter locations. This structure can be used to implement the emitter array shown in FIGS. 2A and 2B so that different optical beams produced at the different emitter locations can be directed to different directions as the optical output of the system. In this design the emitter spacing limits the spatial resolution of the beam steering system. High packing density nanoscale emitters and associated switching fabric may be provided to achieve this design. For maximum efficiency the emitter may possess a radiation pattern that is highly directional. For maximum stability the emitter may include a material system that minimizes absorptive loss and subsequent heating of the device during operation.

Figure 3A:
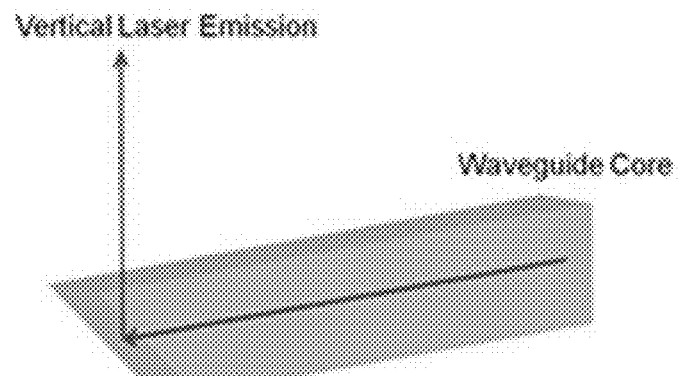
FIGS. 3A-3C show an example of an emitter subsystem architecture, including a vertical emitter formed by the angled termination of a waveguide segment used as an individual light emitter (FIG. 3A), an optical switching fabric formed by a network of waveguides and optical rings at different output waveguide segments (FIG. 3B), and guided mode displaying field localization in a nanostructured waveguide (FIG. 3C).
Figure 3B:
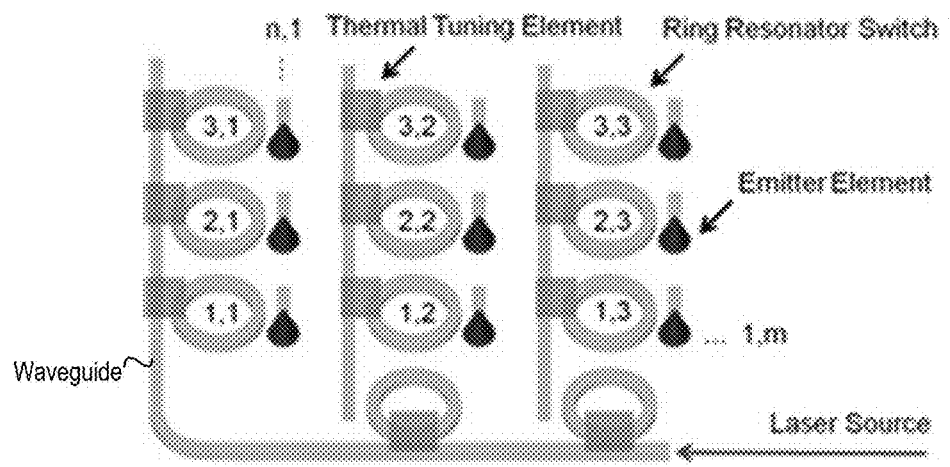
Figure 3C:
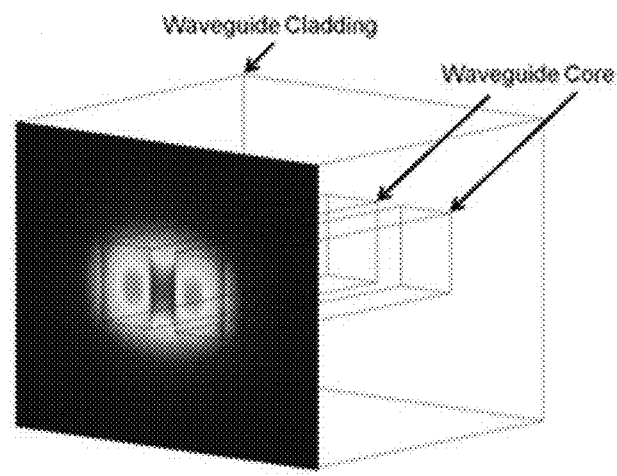

FIGS. 3A-3C show an example of an emitter subsystem architecture. Specifically, FIG. 3A shows a vertical emitter formed by the angled termination of a waveguide segment used as an individual light emitter, and FIG. 3B shows an optical switching fabric formed by a network of waveguides and optical rings at different output waveguide segments. Activation of an emitter occurs by operating the ring resonator switches associated with the corresponding row and column. An optical ring resonator switch can be turned on to couple the light received from a respective waveguide into a corresponding vertical emitter as an optical output. Each optical waveguide can be optically to each of the optical ring resonator switches via evanescent optical coupling and a tunable coupling element can be used to tune the coupling condition to turn on the optical coupling from a waveguide to an optical ring resonator switch or turn off the coupling. Each optical ring resonator switch is also optically coupled to a corresponding vertical emitter such as the waveguide emitter shown in FIG. 3A. The tunable coupling element between a waveguide and a ring resonator switch can be a thermal tuning element to change the coupling condition or other tuning mechanism such as an electro-optic device. The tunable coupling elements in the optical switching fabric can be individually controlled to route the master laser beam into one or more desired vertical emitter locations so the diffractive optical system placed above the optical switching fabric can direct the output light in a desired output beam direction or in a desired beam scanning path or pattern. FIG. 3C shows guided mode displaying field localization in a nanostructured waveguide.

In implementations, various directional couplers may be used to implement this design (such as grating couplers, plasmonic nanoantennas, et cetera). However, given that packing density improves the device beam steering precision, the emitter subsystem may be implemented to achieve extremely small footprint and high packing density that is particularly well suited to some embodiments of the disclosed technology. Specifically, the emitter subsystem may be implemented using an input single mode waveguide that is terminated at an angle, causing the guided mode to reflect in the desired direction as illustrated in FIG. 3A. This process is analogous to the phenomenon of the total internal reflection. In an implementation, this design may employ purely dielectric materials to possess negligible absorptive loss.

Referring to FIG. 3B, individual emitter elements may be selectively activated as follows. The emitter elements may be arranged in a rectangular array fed by waveguides. Laser light will be launched into a waveguide parallel to the bottom emitter row, and may then be directed into a desired column waveguide using a ring resonator switch. An identical switch may then be used to direct the laser light entirely into the desired emitter. In the illustrated example, in FIG. 3B, the switches may be thermally driven by resistive heating elements. In some embodiments of the disclosed technology where activation of an emitter occurs by operating the ring resonator switches associated with the corresponding row and column, only two switches are turned on. In some other embodiments of the disclosed technology, a multistage network topology can be also used.

Referring to FIG. 3C, a high power operation can be achieved using a nanostructured waveguides with transverse electric (TE)-like mode localized in low index gaps (SiN, TiO, etc.), potentially supporting operation with 24 W CW laser power.

In some embodiments of the disclosed technology, any conventional waveguide switching technology can in principle be employed to create the switching fabric. For example, ring resonators can be used to implement a multiwavelength operation. In an implementation. the ring resonators can be configured to transmit at multiple resonance wavelengths, separated uniformly by a spacing known as the free spectral range. These resonators may be operated as switches because the resonant wavelengths depend on the temperature of the ring. Since each of these resonance wavelengths is tuned simultaneously when switching, it is possible to use a single ring to switch multiple wavelengths. This enables the device to efficiently steer a broadband beam using a single pair of switches.

In order to enable operation with high laser power, the emitter subsystem implemented based on an embodiment of the disclosed technology may employ nanoscale structured waveguides to provide a desired maximum power tolerance. These waveguides can be structured to improve power tolerance by localizing the optical field in gaps of the nanostructure that contain thermally resistant cladding. This will redirect the thermal stresses from the waveguide core as illustrated in FIG. 3C. Ordinary micron scale dielectric waveguides, in which the field is concentrated in the waveguide core, have been experimentally demonstrated to tolerate as much as 12 W of CW power. Since the nanoscale structured waveguides implemented based on an embodiment of the disclosed technology can move a majority of the field out of the waveguide core, they can be expected to enable the transmission of CW optical power in excess of 24 W.

The proposed design may be applied to a suitable spectral regime. The appropriate fabrication technology is determined by the desired operating wavelength, which limits the material systems available for the optical elements based on the spectral absorption. Viable CMOS compatible candidates are Si3N4 on SiO2 for operating wavelengths between 300 nm to 3.5 μm, and Si on SiO2 for 1.2 μm to 5 μm. In either case the fabrication process is similar.

In some embodiments of the disclosed technology, the planar lens systems may be fabricated from a double sided polished wafer using lithography and reactive-ion etching (RIE) such as RIE dry etching. The lenses may include deeply subwavelength nanoholes that function as a dielectric metasurface. The density of the nanoholes may be modulated on a deeply subwavelength scale in order to produce the index grading that is optimal for Fresnel zone plates. Anisotropic variation of the nanoholes may also make possible artificial birefringence within the zone plate elements. The waveguides may be patterned and etched through a similar process, and clad using, e.g., plasma-enhanced chemical vapor deposition (PECVD). The tuning of the switches may be performed thermally. For this, metallic resistive heating elements may be deposited above the waveguide cladding to locally modulate the refractive index via the thermos-optic effect.

One application of the disclosed beam steering is for use with various free-special optical communications (FSOC) systems. This combination of the disclosed beam steering technology and the FSOC applications can be used to mitigate technical issues associated with beam scanning with moving parts and other beam steering based on optical phased arrays (OPA), which in fact implement programmable diffractive optical element for beam forming. Although OPAs are an elegant non-mechanical beam steering approach, the technical and environmental challenges compared to millimeter wave and RF systems (thousands of times smaller wavelengths and tolerances) are daunting. Furthermore, multi-wavelength operation with acceptable losses poses additional technical challenges for such OPAs. For these reasons, various embodiments of the disclosed technology may provide alternative novel non-mechanical beam steering approaches for FSOCs that lend itself both to miniaturization as well as multispectral operation.

Figure 4A:
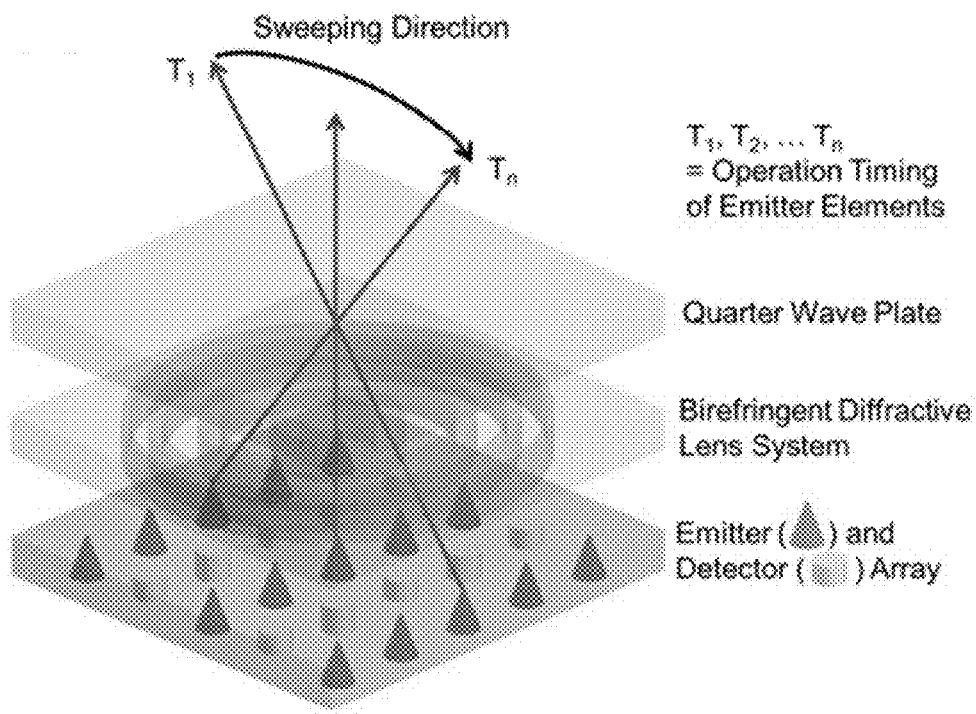
FIGS. 4A and 4B show an example of the beam steering system, including an angular steering is performed by sequential activation of the individual emitter elements (FIG. 4A) and an overview of the subsystems of the total device (FIG. 4B).
Figure 4B:
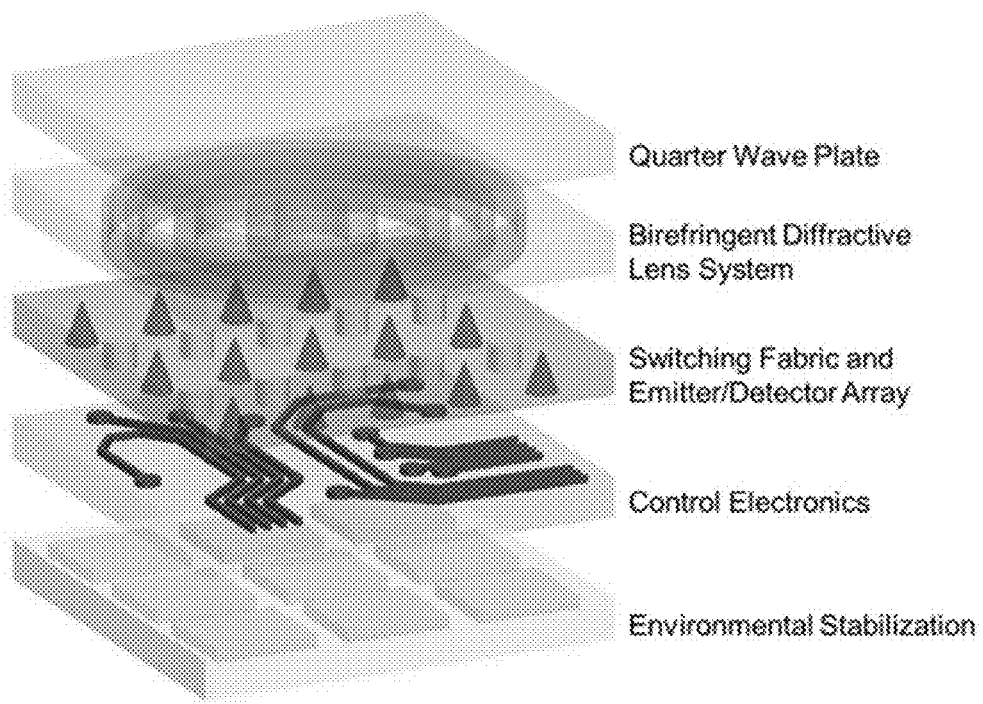

FIGS. 4A and 4B show an example of the beam steering system. Specifically, FIG. 4A shows that an angular steering is performed by sequential activation of the individual emitter elements. The emitted polarized radiation is collimated in each direction by the diffractive lens system. The birefringence of the imaging system enables the device to operate as a receiver for orthogonally polarized optical input signals. FIG. 4B shows an overview of the subsystems of the total device. The free space far field can be expressed as:

$$\delta(\xi-x_i,\eta-y_i)\exp[-j2\pi(f_x\xi+f_y\eta)]d\xi d\eta=\exp[-j2\pi(f_x x_i+f_y y_i)]$$

where $f_x=x/(\lambda f)$, $f_y=y/(\lambda f)$ with deflection angles $\Phi_x \sim x_i/f$, $\Phi_y \sim y_i/f$. Optimized lens can provide wide angular bandwidth (>100°) with high resolution (<0.1°).

In some embodiments of the disclosed technology, the beam steering system may include a birefringent planar imaging system combined with a uniform array of interspersed nanoscale optical emitters and detectors in one focal plane, with transmission and reception occurring on orthogonally polarized beams, as illustrated in FIGS. 4A and 4B. When operated in transmission mode, this is the integrated chip-scale equivalent of a Rotman lens antenna. More specifically, transmission occurs by the selective activation of an individual emitter, which will send out a collimated polarized beam at an angle that depends on the position of the emitter within the focal plane. The selective activation can be realized on a chip using various switching fabric architectures (e.g., cross-bar, multistage network, etc.). Successive activation of emitters can thus be used to direct the beam across the entire aperture of the transmission system as illustrated in FIG. 4A. It should be noted that an integrated modulator/encoder can be integrated on the same chip and be driven by electronics imposing various modulation and coding protocols. The device can also simultaneously act as a receiver over the same transmitter/receiver aperture, since the birefringent optical relay system will direct a beam with orthogonal polarization onto the detection elements, as illustrated in FIG. 4B. There are no coherence requirements on the sources within the array since only a single emitter is active at any time. Multi-spectral transmission is possible through the use of broadband emitters, while multi-spectral reception is possible through the use of dispersive optical elements that direct different wavelengths to different detectors or focal planes.

In some embodiments of the disclosed technology, the beam steering system may include a planar birefringent Fourier transform lens, an emitter/detector array and associated photonic switching fabric with integrated modulator integrated with external laser, an electrical control and signal processing electronics for modulation and detection, and a monitoring and environment stabilisation system, as illustrated in FIG. 4B. The diameter (aperture) of a single unit cell may be limited by the available nanofabrication technology (~1 cm), but multiple unit cells can be combined to form an aperture of any size.

Figure 5A:
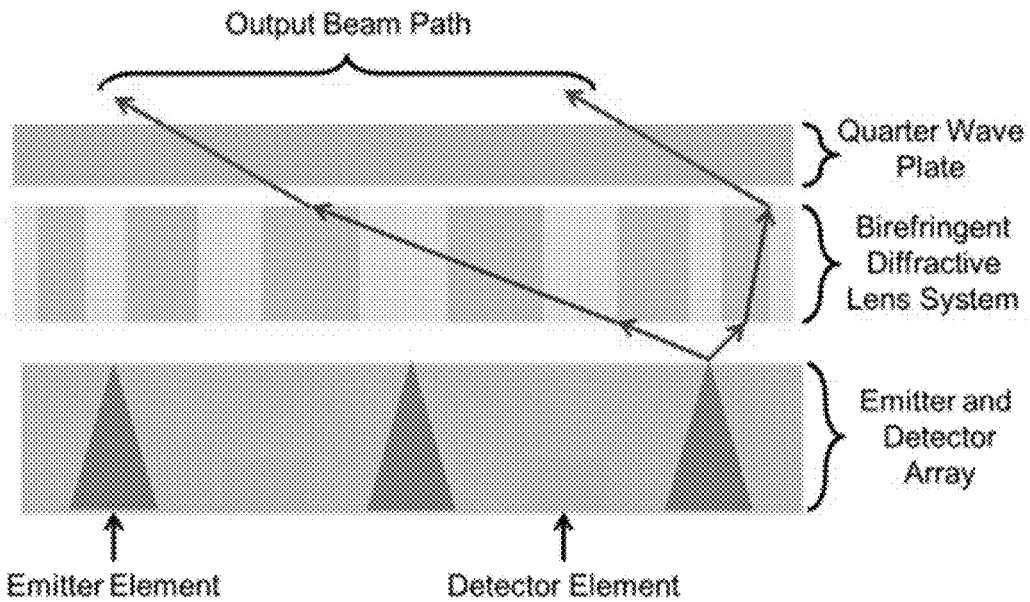
FIGS. 5A and 5B show a cross section of the optical beam steering device during light emission (FIG. 5A) and reception (FIG. 5B).
Figure 5B:
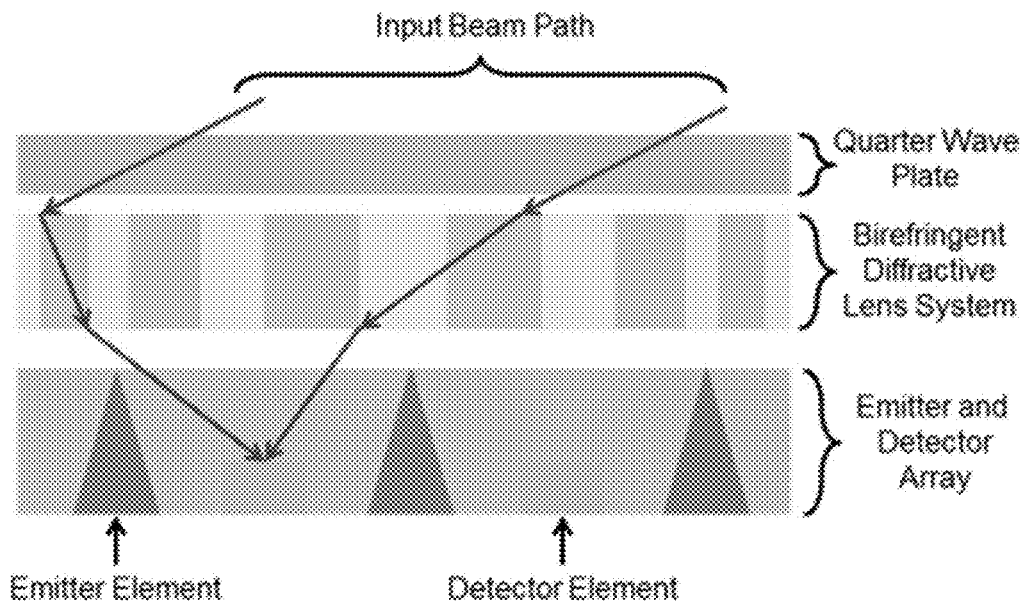

FIGS. 5A and 5B show a cross section of the optical beam steering device having both light emitters and optical detectors to enable light emission and beam steering (FIG. 5A) and optical reception (FIG. 5B). In this example, an array of light emitters is provided and optical detectors are spatially interleaved with the light emitters but are spatially offset from light emitters. The lateral offset of the transmission and reception optical paths of the emitters and detectors can be achieved by off centering the diffractive lens elements for each polarization, whereas vertical offset can be achieved by engineering the birefringence. In implementations, the light emitters may be arranged in rows and columns on the same focal plane as the plurality of light selectors.

In some implementations, a birefringent lens made of artificially engineered material can operate in a broad spectral range. Multi-beam broadcast operation can be realized with this highly flexible approach employing the switching fabric. Compared to more conventional designs this approach has reduced size and weight, relaxed coherence requirements, improved robustness and reliability, and superior operating efficiency. The result is an integrated, scalable, compact, non-mechanical broadband optical transceiver that can be manufactured with CMOS compatible process.

The transmission in a transverse electric (TE) field is Fourier transformed by the TE birefringent lens ($f_{TE}$) followed by quarter wave plate to transmit circularly polarized beam. Input (received) beam is converted by quarter wave plate to a transverse magnetic (TM) and focused by the TM birefringent lens ($f_{TM}$) onto a photodetector. The birefringent lenses are engineered such that centers of TE and TM lenses are shifted to accommodate the emitter-detector shift and $f_{TM} > f_{TE}$ to achieve vertical offset.

Figure 6:
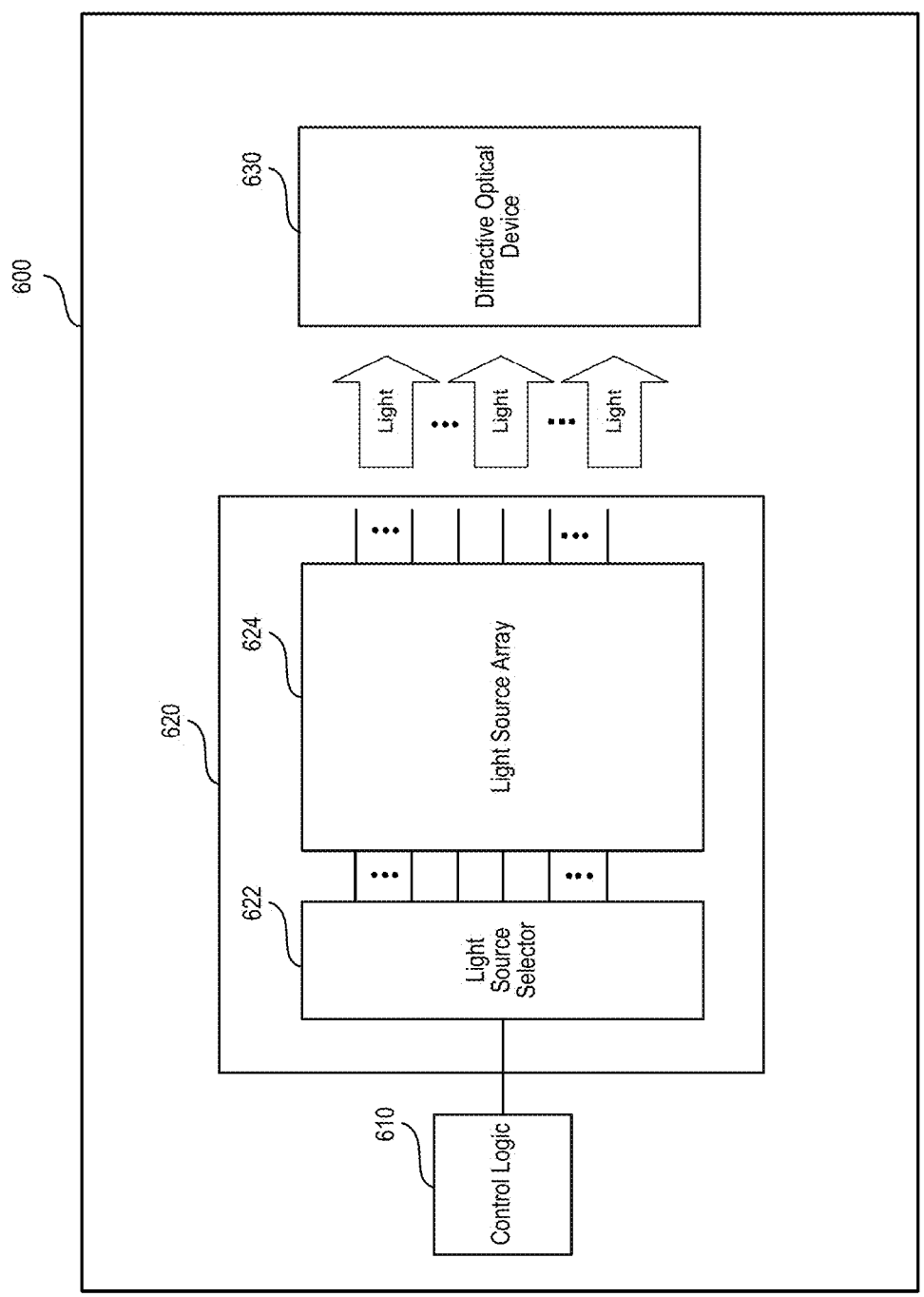
FIG. 6 shows an example of the beam steering system implemented based on an embodiment of the disclosed technology.

FIG. 6 shows an example of the beam steering system implemented based on an embodiment of the disclosed technology. The beam steering system 600 may include a control logic 610, a light emission device 620, and a diffractive optical device 630. The light emission device 620 may include a light source array consisting of a plurality of light sources located at different locations. Each light source can be selected according to a location of the light source, each of which is associated with a location on the diffractive optical device 630.

In some embodiments of the disclosed technology, the light emission device 620 includes a light source selector 622 and a light source array 624 coupled to the light source selector 622. The light source selector 622 is configured to select a light source element from the light source array 624 based on address information provided from the control logic 610. Here, the address information includes information on the locations of the light sources in the light source array 624.

In some embodiments of the disclosed technology, the control logic 610 is coupled to the light source selector 622 to turn on or off the light sources to project one or more optical beams from the light sources to the diffractive optical device 630 which in turn directs the received one or more optical beams to corresponding one or more particular beam directions. The control logic 610 is operable to selectively turn on and off different light sources in the light emission device 620 to project the different optical beams from the light source(s) selected by the light source selector 622 to form a desired beam scanning pattern.

The diffractive optical device 630 is located at a fixed position relative to the array of light sources of the light emission device 620 such that optical paths of the optical beams from the array of light sources are selected and a collimated beam is produced at different angle depending on the location of incident light on the diffractive optical device 630. The light beam output from the light emission device 620 is directed to the diffractive optical device 630, and the resulting light radiation is collimated by the diffractive lens system. The direction of the collimated output beam is determined by the position of the selected light source in the light emission device 620, and the light radiation may be steered by activating the light sources in the light emission device 620 in a desired sequence.

Figure 7:
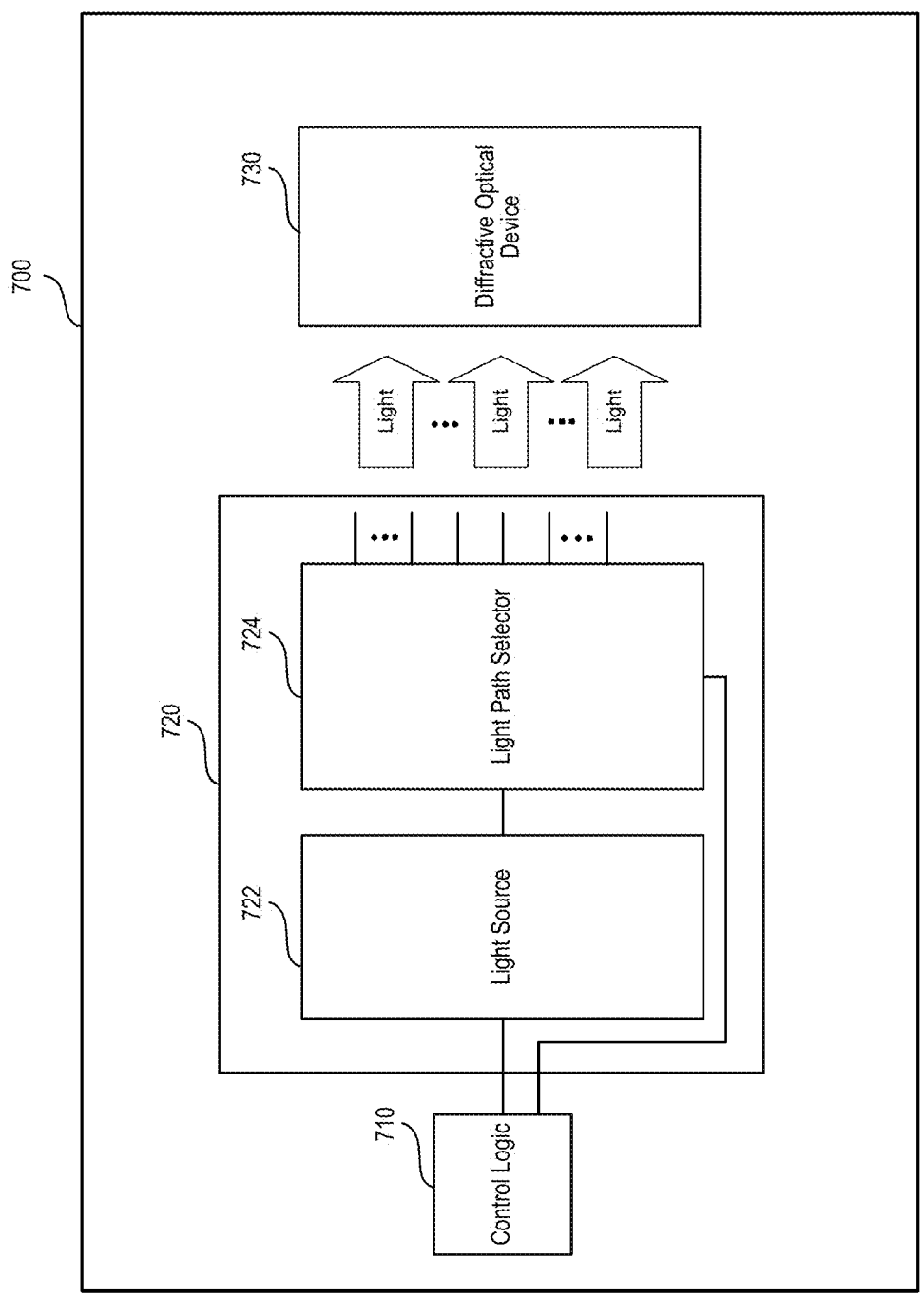
FIG. 7 shows another example of the beam steering system implemented based on another embodiment of the disclosed technology.

FIG. 7 shows another example of the beam steering system implemented based on another embodiment of the disclosed technology. The beam steering system 700 may include a control logic 710, a light emission device 720, and a diffractive optical device 730. Unlike the configuration illustrated in FIG. 6, the light emission device 720 may include a light source 722 configured to generate a light beam and a light path selector 724 configured to provide a plurality of light paths to direct the light beam generated by the light source 722 to a desired location on the diffractive optical device 730 by selecting one or more of the light paths. For example, the light path selector 724 may be implemented using a network of waveguides that distributes the light beam to different locations so that different optical beams can be output at the different locations.

In some embodiments of the disclosed technology, the control logic 710 is coupled to the light source 722 to turn on or off the light source 722 and is also coupled to the light path selector 724 to project, by selecting one or more light paths, one or more optical beams from the light source 722 to the diffractive optical device 730 structured to direct the received one or more optical beams to corresponding one or more particular beam directions to form a desired beam scanning pattern.

Figure 8:
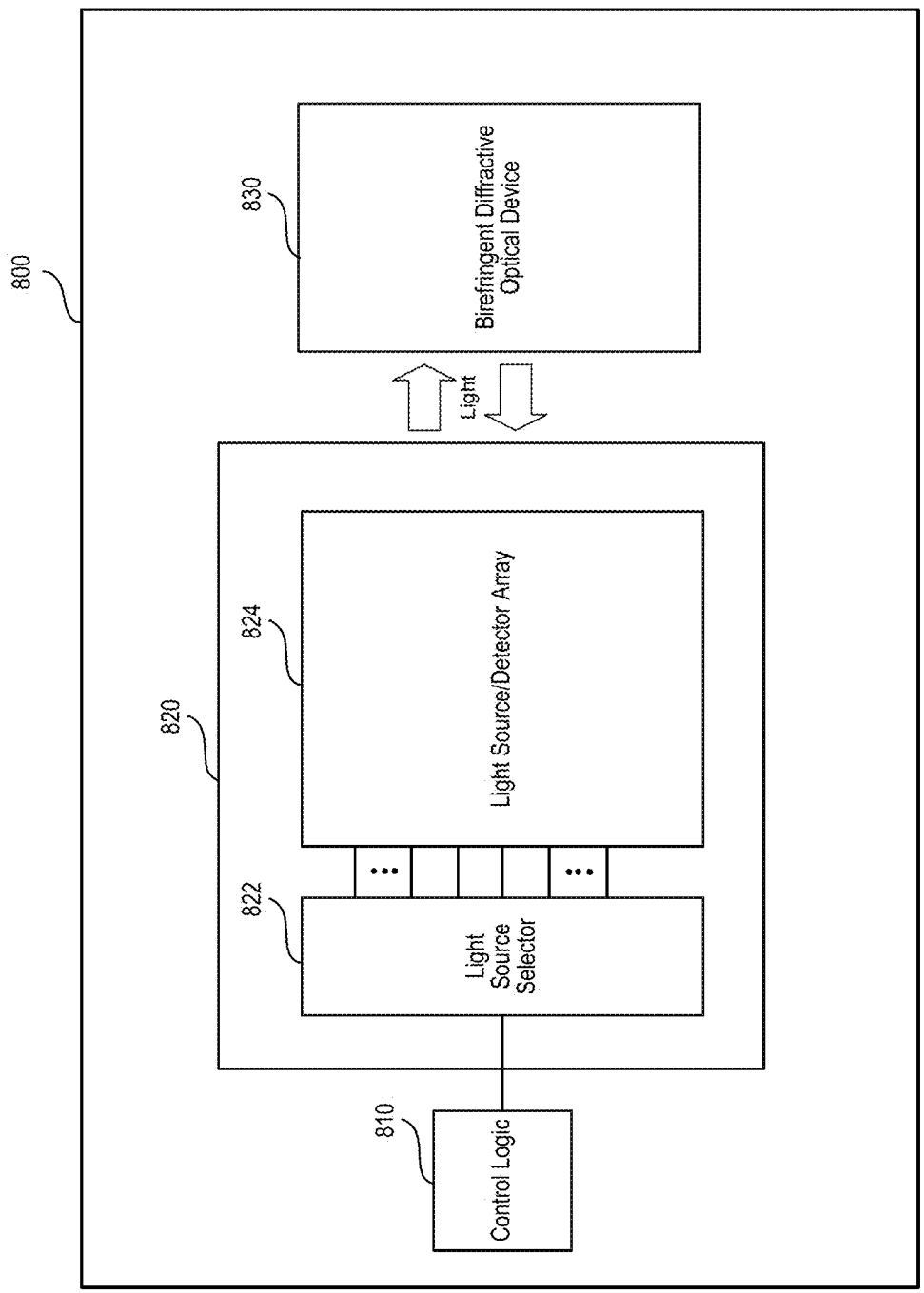
FIG. 8 shows another example of the beam steering system implemented based on another embodiment of the disclosed technology.

FIG. 8 shows another example of the beam steering system implemented based on another embodiment of the disclosed technology. The beam steering system 800 may include a control logic 810, a light emission device 820, and a birefringent diffractive optical device 830. The light emission device 820 may include a light source/detector array 824 including a light source array consisting of a plurality of light sources located at different locations and a light detector array consisting of a plurality of light detectors located at different locations. The light sources are used to transmit light through the birefringent diffractive optical device 830 and the light detectors are used to receive incoming light from the birefringent diffractive optical device 830.

Figure 9:
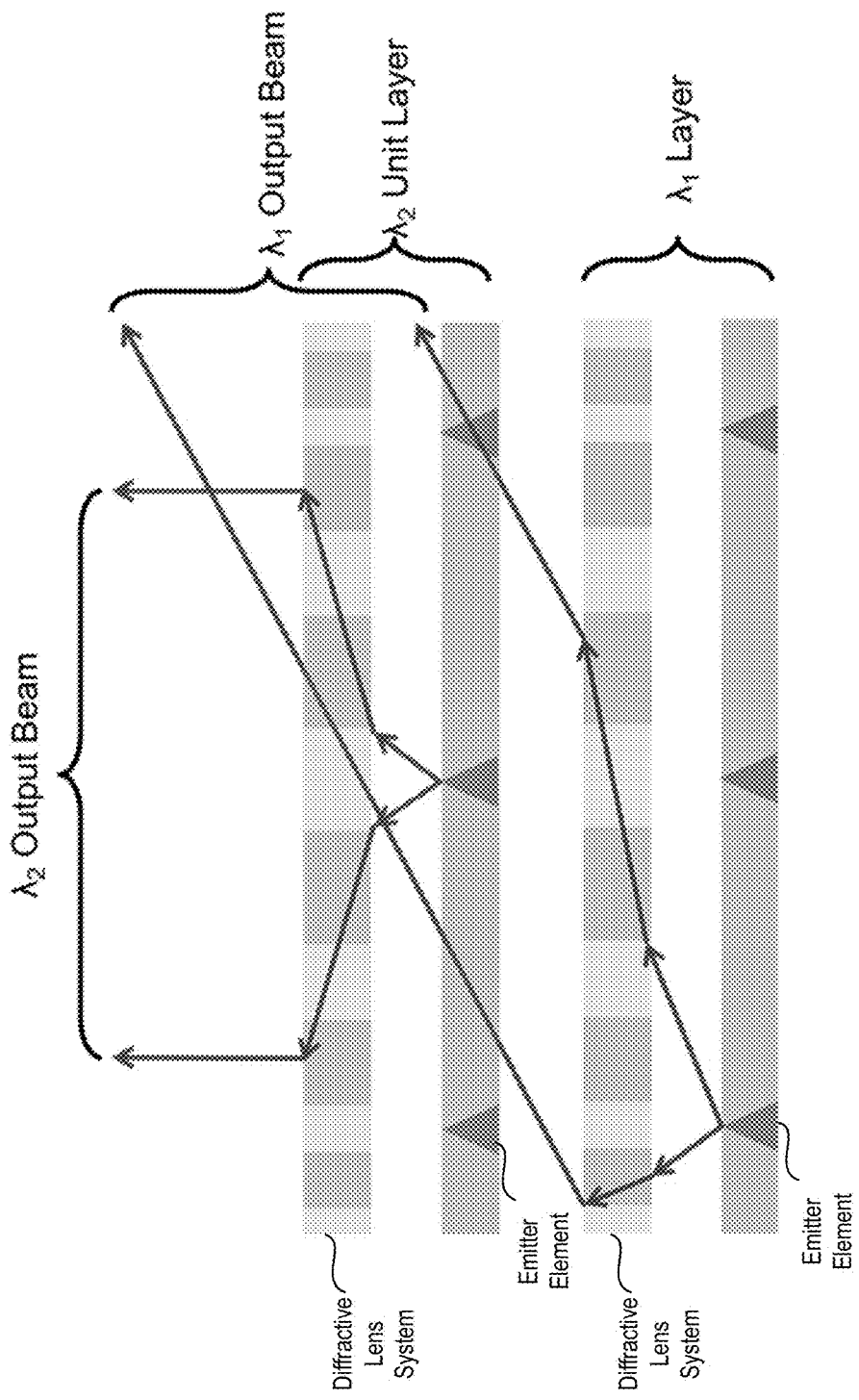
FIG. 9 shows another example of the beam steering system implemented based on an embodiment of the disclosed technology.

FIG. 9 shows another example of the beam steering system implemented based on an embodiment of the disclosed technology. In this example, different arrays of light emitters at different optical wavelengths are provided at different layers. The first wavelength layer in this example includes a first light emitter layer having an array of light emitters at different locations to emit light at a first wavelength. A first diffractive optical element system is placed above the first light emitter layer to steer the output light at the first wavelength from the first light emitter array. One or more different wavelength layers are stacked over the first wavelength layer to provide output and beam steering at other wavelengths. In this example, a second light emitter layer having an array of light emitters at different locations is provided to emit light at a second wavelength. A second diffractive optical element system is placed above the second light emitter layer to steer the output light at the second wavelength from the second light emitter array. The light at the first wavelength can pass through the second wavelength layer so that light at different wavelengths can be generated. Unlike some phased array designs, this beam steering system implemented based on the disclosed technology does not rely on source coherence by turning on or activating a single emitter in a light emitter layer at a time, allowing operation at multiple wavelengths through the use of the wavelength-division multiplexed (WDM) channels. Simultaneous multi-beam, multi-spectral operation can be realized with the highly flexible approach disclosed in this patent document. For example, the output light at different wavelengths may be steered independently in certain applications while output light at the different wavelengths may also be steered together by synchronizing the control of the light emitters in the two different emitter layers.

As an example, a fully packaged one-dimensional beam steering system that is based on a fully CMOS compatible silicon photonics platform is discussed below. This configuration enables multi-wavelength operation and is suitable for short-wavelength infrared (SWIR) applications from light detection and ranging (LIDAR) to telecommunication and sensing applications. The switching fabric in this system employs a 1×9 array of add/drop ring resonators that are fed by a common waveguide through a single etch input grating. The switching fabric re-directs the resonance wavelengths at each drop waveguide to the output facet at the edge of the chip and into free space. The divergent beams that exit the waveguides along the output facet are then collimated and magnified using an array of micro-lenses (pitch=750 μm, Diameter=700 μm) in addition to a two lens afocal system in order to enhance the fill factor and diminish any blind zones between adjacent beams. Each one of these drop waveguides is used to address portion of the steering aperture. Combined together they enable steering across the entire aperture. Multi-wavelength operation is obtained by placing individual titanium tungsten alloy (TiW) heaters on top of each ring resonator to enable wavelength tuning.

There has always been significant interest in optical beam steering and its applications, particularly for light detection and ranging (LIDAR) applications. While the concept of beam steering itself is not new, advancements in high volume CMOS manufacturing provide a unique opportunity to address the demand for the miniaturization and simplification of these typically complex systems. Conventional optical beam steering systems are often large, heavy, and expensive primarily due to the mechanical components and bulky optics that comprise these free-space optical systems. Typically, such aspects cannot be tolerated due to strict limitations on their size, weight, reliability and cost. There is a long history of research efforts directed towards mitigating these issues. Most recently, publications have focused on non-mechanical beam steering systems based on integrating phased arrays, in which one-dimensional (1D) and two-dimensional (2D) beam steering systems were tailored towards LIDAR applications. While phased array systems are an elegant solution for beam steering, the required emitter spacing scales with operating wavelength. Compared to existing radio frequency (RF) systems the operating wavelengths and therefore design tolerances of optical systems are on the order of 10,000 times smaller. Practical realization of such devices is sufficiently prohibitive that a number of alternative techniques have been pursued. One such alternative is to utilize a planar imaging system combined with a uniform array of nanoscale optical emitters in a single focal plane. Compared to conventional methods this approach has reduced size and weight, relaxed coherence requirements, potential for broad operational bandwidth, improved robustness, reliability, and superior operating efficiency. The result is an integrated, scalable, compact, non-mechanical broadband beam steering system. Such a design has been either proposed or demonstrated in; however, the fill factor, defined by the ratio between the emitted beams coverage area and the area it scans, remain an issue. In order to enhance the fill factor to reach a value of unity or slightly larger, the blind-zones between the adjacent emitters need to be eliminated. One approach is to expand the beams by defocusing the optical emitters causing the beams to diverge and become larger thus eliminating the blind-zones. Moreover, the use of a larger focal length diverging lens could increase the effective range of the beamsteering device by partially compensating for the divergence. Nonetheless, the use of a diverging beam for illumination reduces performance due to the following issues: (i) illumination spot size with divergent illumination varies as a function of 3D object/scene depth affecting spatial resolution, and if using multi-beam scanning it will additionally cause crosstalk; (ii) illumination power attenuates strongly with distance from the device, strongly limiting scanning range; (iii) to avoid these effects one could use mechanical adjustment to keep the illumination area constant by tuning the focal distance, but this in turn will slow down the scanning time, cause mechanical instabilities, and be subject to fatigue. An alternative approach presented in this manuscript is to introduce a micro-lens array in the planar imaging system, in which each individual emitting beam fills up a particular micro-lens according to its location, thereby expanding and collimating the beam, enhancing the fill factor. Moreover, our solution is non-mechanical, requiring no adjustment of the emitter's location in order to enhance the fill factor while maintaining minimally divergent illumination and resolution over a 3D object. Furthermore it is compatible with planar lenses, such that significant weight reduction is possible. This is analogous to the Rotman lens antenna employed in RF systems.

Figure 10:
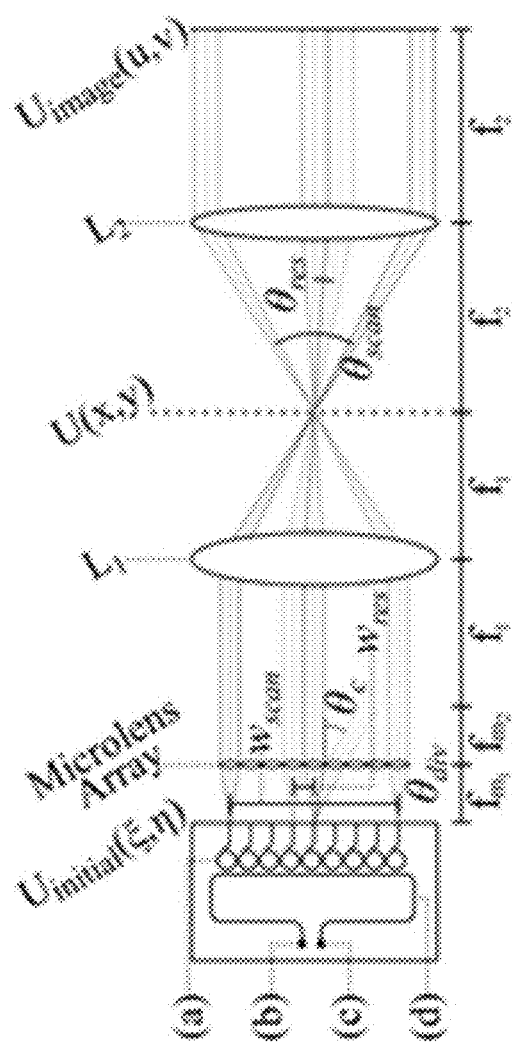
FIG. 10 shows an overview of a one-dimensional (1D) integrated photonic beam steering system.

FIG. 10 shows an overview of a one-dimensional (1D) integrated photonic beam steering system. The angular resolution and scanning angles are shown to be dependent to the emitter (waveguides) pitch. $fm_1$ and $fm_2$ are the back and front focal lengths of the micro-lens array. $L_1$ and $L_2$ are the Fourier lenses, $U(x,y)$ and $U_{image}(u,v)$ are the Fourier and image planes, respectively. The photonic chip consists of: (a) Ring resonators, emitters (waveguides), and heaters, (b) Output grating, (c) Input grating, (d) Bus waveguide. The beams propagating from the waveguide emitters and exiting the lens-let array are represented by $U_{initial}(\zeta,\eta)$.

The basis of the 1D beam steering system that was demonstrated in this patent document is similar to that of the 2D beam steering systems, where an external planar imaging system consisting of one or more lenses is integrated with a fully packaged silicon photonic chip. The photonic chip itself contains both a 1D switching fabric, which is an array of identical ring resonators, and optical emitters, realized by edge emitting waveguides. The laser source is coupled into the chip through a single-mode bonded fiber on a waveguide grating coupler and is then routed through the switching fabric by a common bus waveguide where the resonant wavelength is coupled to the drop waveguide of each ring resonator and then emitted into free space (see FIG. 10). The axial position of the individual active (emitting) waveguide with respect to the optical axis of the imaging system (see FIG. 10) can be controlled by the corresponding individual ring resonator switches. The waveguide output is then mapped by the optical system into the far field as collimated beams to perform scanning function for sensing applications (e.g. LIDAR). The angle of the output beam is determined by the axial position of the active waveguide.

The imaging system is a combination of a micro-lens array and a collimating lens system (afocal system), in which, the micro-lens array is used to collect and collimate the highly divergent output beams from the drop waveguides. In addition, the micro-lens array is used to enhance the fill factor of the beams, thus diminishing blind zones caused by the distance between neighboring output waveguides. The afocal system is then used to magnify and redirect those collimated beams into the far field. The transverse location of those collimated beams in the far field is determined by the location of the output waveguides.

Next, we briefly describe the optical system to determine the relation between the optical image in the far field, $U_{image}(u, v)$ and the initial optical field at the output of lens-let (i.e., micro-lens) array, $U_{initial}(\xi,\eta)$:

$$U_{image}(u, v) = \frac{1}{|M|} U_{initial}\left(\frac{u}{M}, \frac{v}{M}\right), \quad (1)$$

$$\text{Magnification } (M) = -\frac{f_2}{f_1}. \quad (2)$$

It is common in scanning systems to consider the angular resolution, $\theta_{resolution}$ and the scanning angular range, $\theta_{scanning}$, which will depend on the spacing between output waveguides in our system (emitters) and the total number of emitters on the chip:

$$\theta_{resolution} = \tan^{-1}\left(\frac{w_{res}}{f_1}\right), \quad (3)$$

$$\theta_{scanning} = \tan^{-1}\left(\frac{w_{scan}}{f_1}\right), \quad (4)$$

where f1 is the focal length of the first Fourier lens, L1 in FIG. 10, $w_{res}$ is the distance between adjacent edge emitting waveguides of the chip that is designed to adapt to the micro-lens array parameters (whose pitch=750 μm, diameter=700 μm), and $w_{scan}$ is the distance between the farthest waveguides in this design, i.e., (N−1)$w_{res}$, with N being the number of emitters on a chip yielding N resolvable elements in the far field.

Figure 11:
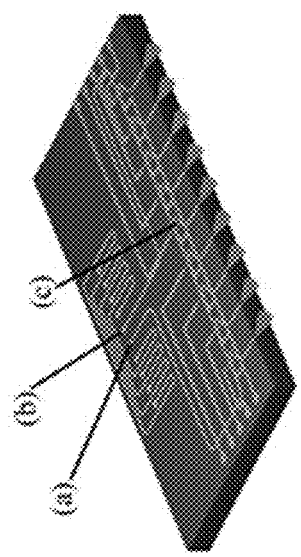
FIG. 11 shows one-dimensional (1D) beam steering system composed of: (a) Input and (b) Output couplers, (c) Ring resonator-based switching fabric with integrated heating elements.
Figure 12:
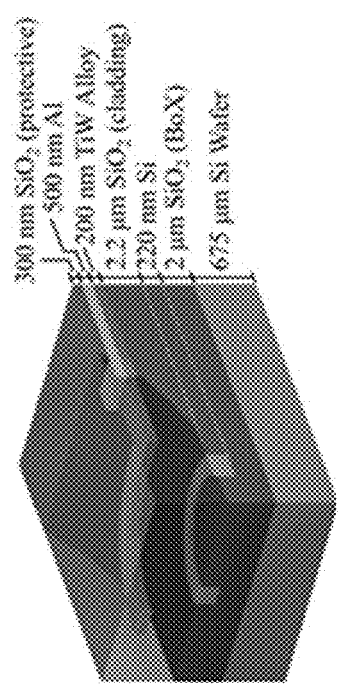
FIG. 12 shows cross section of a ring resonator-based switching fabric in a one-dimensional (1D) beam steering silicon photonic system.

FIG. 11 shows one-dimensional (1D) beam steering system composed of: (a) Input and (b) Output couplers, (c) Ring resonator-based switching fabric with integrated heating elements. FIG. 12 shows cross section of a ring resonator-based switching fabric in a one-dimensional (1D) beam steering silicon photonic system.

The beam steering chip shown in FIG. 11 is designed and fabricated as part of a multi-project-wafer (MPW) run at the Applied Nanotools foundry. A standard silicon on insulator (SOI) wafer with a 220-nm device layer is employed. The designed structures are patterned into the device layer using a soft mask written by electron beam lithography (EBL) and etched by reactive ion etching (RIE). A 2.2 μm thick silicon dioxide (SiO2) top cladding layer is then deposited by plasma enhanced chemical vapor deposition (PECVD). Titanium-tungsten alloy (TiW) heaters are then deposited above each individual ring resonator, which allows dynamical tuning of the switching fabric and are routed to contact pads by a titanium-tungsten aluminum bi-layer, a cross section of one such heating element can be seen in FIG. 3. Finally, the entire chip is cladded with a 300-nm thick layer of silicon dioxide (SiO2) in order to prevent metal oxidation, which can occur under the high voltages used to tune the resonant wavelength of each ring resonator.

As illustrated in FIG. 11, the design consists of a focusing grating coupler that couples the light into a 220-nm tall, 500-nm wide silicon (Si) bus waveguide. This bus waveguide is a common input port and used to couple light into a column of identical ring resonators (1×9) with a 5-μm radius (r). The resonant wavelength of each ring resonator is then coupled to the drop port and emitted into free space while the rest of wavelengths, which are not coupled to any of the resonators, are remaining in the through port and are coupled out of the chip through a focusing grating coupler. The drop ports in this design are approximately spaced by 750 μm to match the pitch of the micro-lens array.

The feed waveguide in our device design is coupled to one or at most few of the ring resonators (for multi-beam scanning), and, therefore, can scale to large size with minimal insertion loss and cross talk. For example, similar Si photonic switching fabrics have been demonstrated that can scale from moderate (i.e., 1024) to large (i.e., 16,384) number of switches, which is sufficient for practical applications. Moreover, with proper design optimization it is shown that such switching fabric can support insertion loss per drop port of less than 0.5 dB and cross talk of −34 dB. Experimental validation of losses per drop port were found to be around 0.375 dB.

In one example, a silicon photonics chip may be implemented in some embodiments of the disclosed technology as discussed below. In the example discussed below, the focusing grating couplers used in this design are separated by a 250-μm pitch (center-to-center) to accommodate the pitch of optical fiber bundles. In addition, the farthest grating couplers are reserved for an optical shunt to aid in the active alignment process used for the signal-mode fiber array.

Figure 13B:
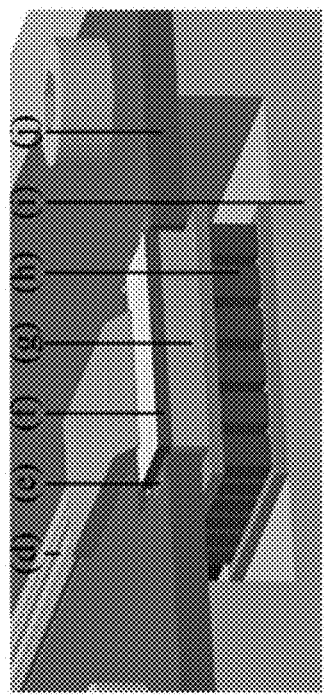
FIG. 13B shows photonics packaging side view.
Figure 13A:
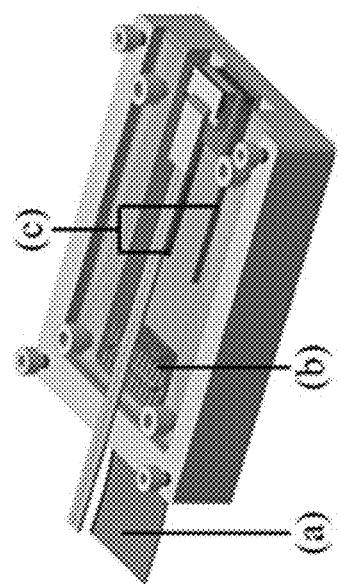
FIG. 13A shows photonics packaging top view.

FIG. 13A shows photonics packaging top view, and FIG. 13B shows photonics packaging side view. Here, "(a)" indicates ribbon cable, "(b)" indicates serial cable connector, "(c)" indicates thermoelectric cooler (TEC) wires, "(d)" indicates optical fiber array, "(e)" indicates bond-pads, "(f)" indicates beam steering chip, "(g)" indicates thermistor, "(h)" indicates thermoelectric cooler (TEC), "(i)" indicates packaging holder, and "(bj" indicates printed circuit board (PCB).

As illustrated in FIGS. 13A-13B, the photonic chip is placed at the edge of a printed circuit board (PCB) and is fixed onto a thermistor, which is placed on a thermoelectric cooler (TEC) that is thermally-bonded to the back side of the PCB. This PCB consists of several tracks, which start and end with bond-pads that are wire-bonded to pads on the photonic chip and to serial cable connectors. An active alignment process is applied to align and bond a single-mode fiber array (angle of incidence=10°) to the chip, in which an index matching epoxy is used to reduce reflections between interfaces. Finally, the entire system is electrically controlled through a ribbon cable connected to the serial cable connector.

Figure 14:
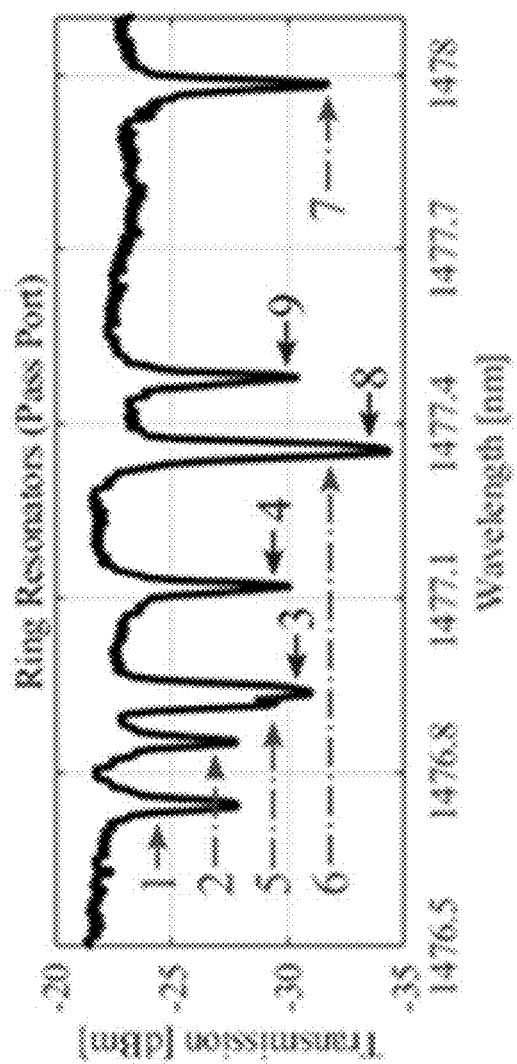
FIG. 14 shows measurement of the transmission spectrum of nine add-drop ring resonators (r=5 μm).

FIG. 14 shows measurement of the transmission spectrum of nine add-drop ring resonators (r=5 μm). The numbers (1 to 9) represents the various resonances for different ring resonators in this design. The measurement took place at room temperature therefore a small wavelength shift occurs compared to FIG. 15.

Figure 15:
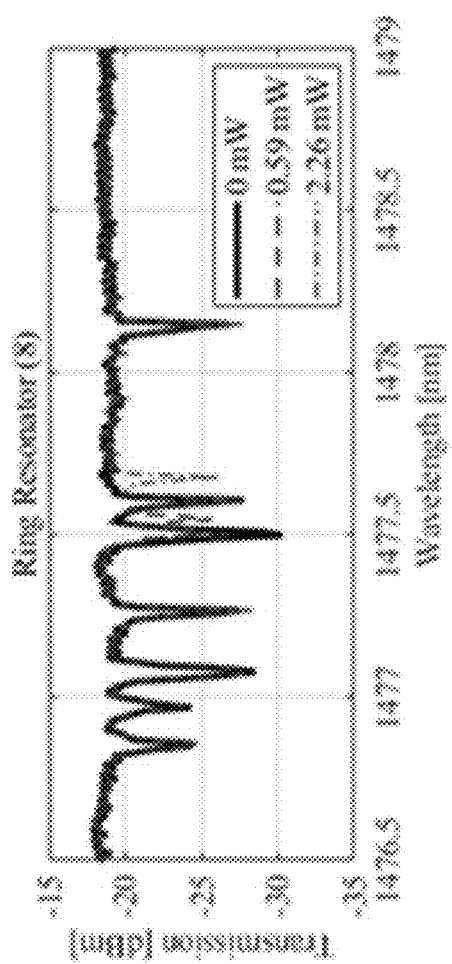
FIG. 15 shows measurement of the transmission spectrum of nine add-drop ring resonators (r=5 μm) while only tuning ring 8.

FIG. 15 shows measurement of the transmission spectrum of nine add-drop ring resonators (r=5 μm) while only tuning ring 8. The measurement took place at room temperature therefore a small wavelength shift occurs compared to FIG. 14.

Nine ring resonators of nominally identical path length are used to form the switching fabric of this system. In principle and according to the Lumerical MODE −2.5D varFDTD-simulations all of those ring resonators should have an identical resonance wavelength in the short-wavelength infrared (SWIR) spectrum. However, due to the large spacing between individual ring resonators (i.e., spacing approximately 750 μm), random fabrication variations lead to random changes in the resonant wavelengths as measured in FIG. 14. Such a variation was anticipated at the design stage, and therefore heaters were employed in order to tune the ring resonators to operate at a common resonant wavelength as illustrated in FIG. 15.

FIG. 14 shows that some resonance peaks have a higher extension ratio (ER) than others. This effect can be explained by the overlapping of two closely lying resonances (e.g. ring 6 and ring 8) therefore resulting in a higher ER. This was verified by separately tuning the overlapping resonances (see FIG. 15). The total ER variations is mainly dependent on the spectral variations in coupling efficiency of the input grating.

The thermo-optic effect allows changes in temperature to induce changes in resonant wavelength of the ring resonators through changes in the effective index of the guided mode, see Eq. (5). Typically, the figure of merit for thermally tune ring resonators is listed in heater power required per nanometer of shift in resonant wavelength. For example, similar thermally tuned ring resonator designs achieve values of 6.19 mW/nm; however, this metric can be significantly improved by introducing thermal isolation trenches. From the thermal tuning of ring resonator 1 which was measured, we can estimate our $$\frac{\Delta P}{\Delta \lambda}$$

coefficient to be $$\frac{1.47 \text{mW}}{0.17 \text{nm}} = 8.65 \frac{\text{mW}}{\text{nm}}$$

which can allow us to estimate the required heater power to shift ring 1 to ring 7 (the furthest two resonances) to be $$1.29 \text{nm} * 8.65 \frac{\text{mW}}{\text{nm}} = 11.15 \text{mW}.$$

By comparing this to the Applied Nano tools reported average failure power for a 10 um radius, 4 um wide heater of 344.51 mW±50.02 mW we see that such a shift is easily achievable. Accordingly, the ring resonator thermo-optic response may be described as follows.

$$\frac{d\lambda}{dT} = \frac{\lambda}{n_g} \frac{dn_{eff}}{dT} = \frac{\lambda}{n_g} \frac{dn_{eff}}{dn} \frac{dn}{dT}, \quad (5)$$

where $n_{eff}$ is the effective refractive index, $n_g$ is the group index, and $\lambda$ is the wavelength. Thermal tuning is an important feature, because it allows mitigation of random fabrication variations, i.e., if the ring resonances could not be fully tuned and detuned to the same wavelength, then there would either be unwanted cross talk in the far-field beam, or blind spots in the scanning range.

Experimental validation of device performance began by detection the field profiles in the absence of micro-lenses. In this demonstration, the emitting waveguides of the silicon photonic chip are placed at the focal position of the first Fourier transform lens (L1) in the afocal system. In this configuration, the afocal system offers 4 times of magnification (4×) such that only 2 waveguides can be simultaneously imaged within the field of view of the FLIR camera. Therefore, verification of all outputs requires horizontal translation of either the camera or the experimental device. As shown in FIG. 7, all the emitting waveguides were alternately tuned to their resonance wavelength and are detected by the FLIR camera.

Figure 16:
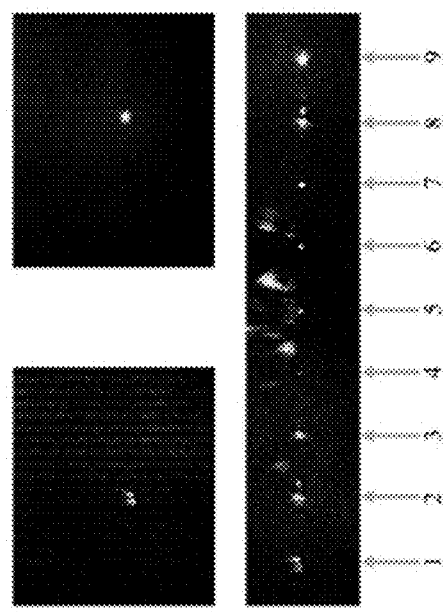
FIG. 16 shows infrared (IR) camera measuring the resonance wavelengths of a 1 by 9 array that is emitting into to free space through the drop waveguides of each ring resonator (without micro-lenses).

FIG. 16 show infrared (IR) camera measuring the resonance wavelengths of a 1 by 9 array that is emitting into to free space through the drop waveguides of each ring resonator (without micro-lenses): (a) Ring 1, (b) Ring 9, (c) All 9 rings (stitched).

In FIG. 16, minor scattering irregularities (e.g. ring 1) can be observed in the transmission of certain waveguides. These arise from imperfections in the diced edge of the photonic chip due to the use of a mechanical dicing tool. This saw based dicing process results in a rough edge facet and thus in a varying degree of scattering. In addition, background noise appears in the center of the chip (e.g. ring 4, 5, and 6). This background noise is most likely from scattering of uncoupled light coming from the input grating couplers, which is centered in the direction of those waveguides as shown in FIG. 11. Regardless, the absence of the micro-lenses clearly illustrates the problem of fill factor. The blind zones between adjacent waveguide emitters will impact the beam steering of such a system and influence the fill factor ratio as follows:

$$\text{Fill factor} = \frac{N_{spot} * D_s * M}{D_{ST} * M} = 0.001\%, \quad (6)$$

where Nspot, Ds, M, DST are defined as the total number of emitting waveguide, the waveguide diameter, the magnification of the afocal system, and the distance between the farthest emitting waveguides, respectively.

Figure 17:
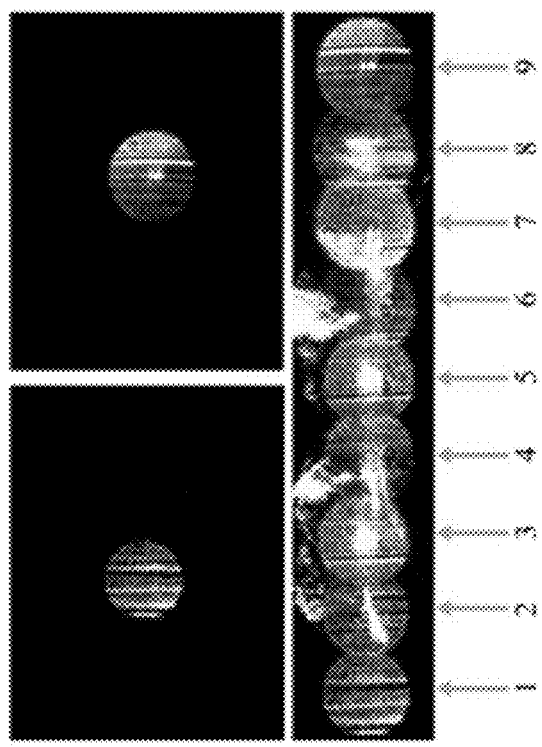
FIG. 17 shows infrared (IR) camera measuring the resonance wavelengths of a 1 by 9 array that is emitting into to free space through the drop waveguides of each ring resonator (with micro-lenses).

FIG. 17 shows infrared (IR) camera measuring the resonance wavelengths of a 1 by 9 array that is emitting into to free space through the drop waveguides of each ring resonator (with micro-lenses): (a) Ring 1, (b) Ring 9, (c) All 9 rings (stitched).

Figure 18:
FIG. 18 shows infrared (IR) camera measuring the resonance wavelengths of ring 5 (left) with and (right) without resonance light emitting.

FIG. 18 shows infrared (IR) camera measuring the resonance wavelengths of ring 5 (left) with and (right) without resonance light emitting.

In order to enhance the fill factor, the blind-zones between adjacent emitters need to be diminished. The optical emitters were defocused from the back focal plane of the first Fourier lens (L1). The intention is to broaden the far field image by diverging the incoming beam and thereby eliminate the blind-zones. This solution focuses on a single depth plane of interest, which illuminates with a beam that is either converging or diverging. Extending it to other depths would, therefore, require mechanical manipulation to obtain the best beam steering results. Consequently, the size, weight and power consumption of the total device will be affected. The alternative approach explored in this work employs collimated beams such that no mechanical manipulation is necessary. Additionally, the array of micro-lenses introduced here expand the emitted beams thus enhancing the fill factor by reducing blind-zones as shown in FIG. 17 and Eq. (7) below.

Despite the inclusion of the micro-lenses, the non-uniform light intensity caused by the reflections and the background noise are still observed, but here clearly using micro-lenses as illustrated in FIG. 18 (e.g. ring 3, 5, and 7), the optical field is expanded to avoid blind-zones in the far field. In order to confirm that the stray light around the center rings arises from unwanted scattering from the grating, ring 5 was turned on and off by tuning the resonance wavelength as shown in FIG. 18. It clearly shows that the scattered noise only occurs within the proximity of the grating coupler. In future designs the light intensity issue can be avoided by placing the input grating at a different location and designing a more efficient edge coupler with a 1.4 dB loss (fiber to silicon waveguide) in contrast to a 6-7 dB loss in the currently tested device (fiber to silicon grating). Any remaining stray light can be eliminated by introducing silicon pillars in the currently un-patterned space on the chip in order to scatter any undesired slab modes. Finally, the beam overlap between adjacent emitting waveguides is a result of inherent inaccuracies in the placement of the micro-lens array at a distance fm1 (see FIG. 10) in the setup.

$$\text{Fill factor} = \frac{N_{lenses} * D_1 * M}{[(N_{lenses} * D_l) + ((N_{lenses} - 1) * D_{ML})] * M} = 94.01\%, \quad (7)$$

where Nlenses, Dl, M, and DML are the total number of micro-lenses, the micro-lense diameter, the magnification of the afocal system, and the gap between the adjacent micro-lenses respectively. Finally, by solving Eq. (3) and Eq. (4) a scanning angle, or field of view (FOV) of 33.7° and an angular resolution of 4.77° is determined.

According to the Lumerical FDTD simulations, it's important to emphasize that the divergent beams (θ div(x/2)≈43.5° and θ div(y/2)≈52.8°) exiting the emitters are leaked into the neighboring micro-lenses (see FIG. 1). However, those beams are collimated with an angle (θc≈30o) thus missing the Fourier lens (L1) of the afocal system. Consequently, no cross talk occurs between adjacent emitters at the image plane. Such a dilemma could be resolved by fabricating the device on a silicon on insulator (SOI) platform with a 3 µm device layer in addition to inverse tapering the waveguide emitters to larger widths thus minimizing the divergence angle (θ div) in both axis.

Figures 19A, 19B:
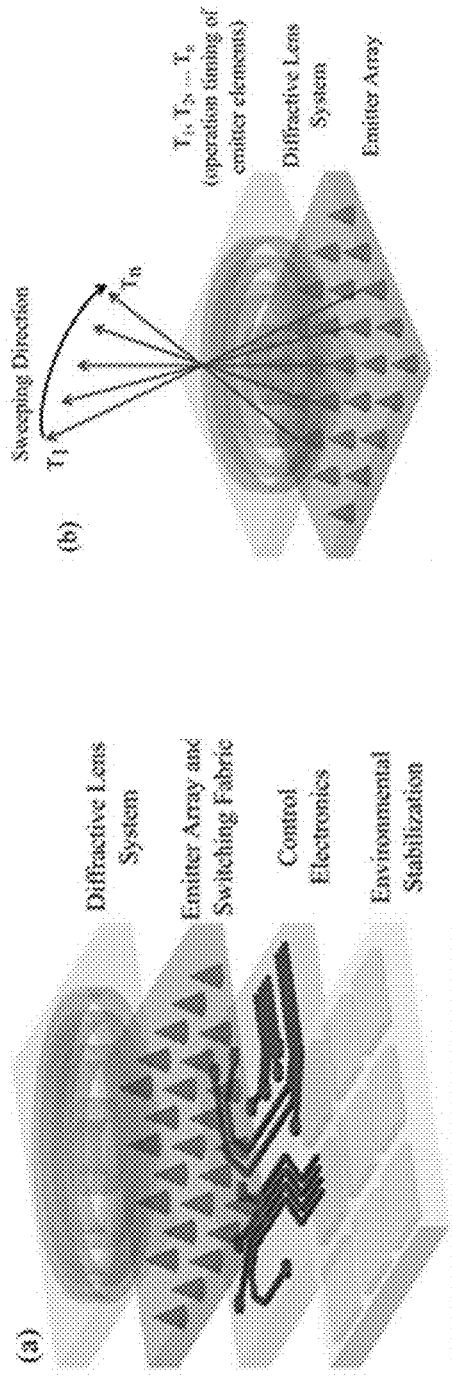
FIG. 19A shows breakdown of the unit cell subsystems.
FIG. 19B shows angular steering is performed by sequential activation of the individual emitter elements.

FIGS. 19A-19B show an architecture of the beam steering system. Specifically, FIG. 19A shows breakdown of the unit cell subsystems, and FIG. 19 B shows angular steering is performed by sequential activation of the individual emitter elements. The emitted radiation is collimated in each direction by the diffractive lens system.

The disclosed technology can be implemented in some embodiments to provide a fully integrated 2D beam steering system that offers a much higher packing density. The proposed architecture consists of four discrete functional layers as shown in FIG. 19A. The first layer is a planar imaging element that transmits, orients, and collimates beams that are emitted from different locations on the chip. This element could be realized by a single graded index Fresnel zone plate, or alternatively a single 2D micro-lens array (commercially available from Axetris down to a pitch of 10 µm and diameter of 9 µm) with an afocal system as shown in this paper. The second layer is a silicon device layer which consists of emitters (e.g. vertical couplers) and a switching fabric (e.g. waveguides and ring resonators). High density vertical couplers can be formed out of plasmonic antennas or angled terminated waveguides. The third layer is an electrical control system layer used to tune the individual heaters placed on the switching fabric. The final layer is an environmental stabilisation layer that monitors and compensates for any environmental temperature fluctuations. The approximate size of each layer including the substrate will be on the order of 1 mm. Since the emitters occupy the entire plane, arbitrary 2D illumination can be realized (see FIG. 19B for an example of how a beam could be swept across the center plane of the device).

Since the switching is performed in a non-mechanically manner, the device lifetime could be comparable to that of integrated CMOS circuitry and the estimated performance of such a 2D beam steering system is summarized in TABLE 1:

TABLE 1

| Device Parameter | Estimated Performance |
|---|---|
| Switching Time | 10 µS |
| Switching Power | 100 µW |
| Scanning Angle | >120° |
| Angular Resolution | 0.5° |
| Bandwidth | Si3N4/SiO2: 300 nm-3.5 µm |
| | Si/SiO2: 1.2 µm-5 µm |
| Maximum CW Beam Power | >20 mW |

Figure 20:
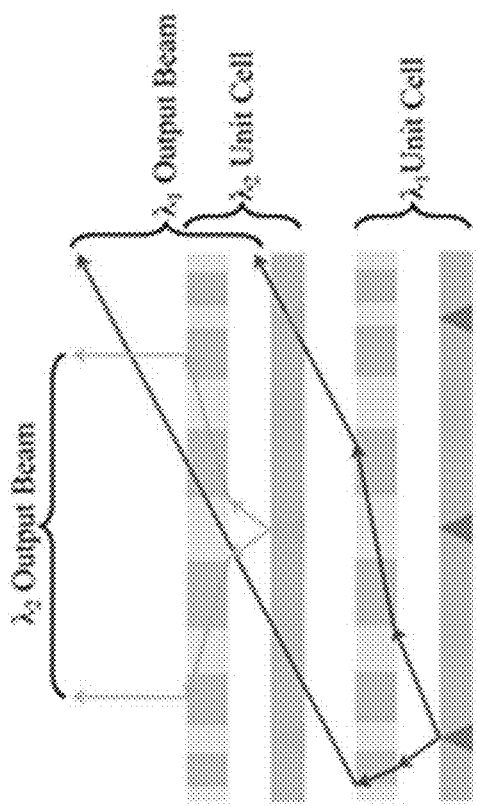
FIG. 20 shows a vertical cascade of independently operating narrowband unit cells.

The design shown in FIG. 19A is highly modular and can be extended to multi-beam operation through the addition of additional stacked device layers. Such a system can be envisioned as a vertical cascade of independently operating narrowband unit cells (see FIG. 20). This arrangement is possible due to the fact that the diffractive lens system in each layer can be designed to have an additional phase mask that accounts for the unwanted phase modulation induced by the transmission through the subsequent layers in the stack. Such an approach will enable a wider range of bandwidths of operation in which the focal length of the imaging system varies accordingly to the wavelength. From there, as illustrated in FIG. 20, a set of emitter arrays could be simultaneously operated according to the wavelength and its focal plane. The additional device layers can be composed of any CMOS compatible optical material, such as silicon nitride (Si3N4), which is optionally available at most commercial SOI photonics foundry runs.

As discussed above, the disclosed technology can be implemented in some embodiments to provide a fully integrated 1D beam steering system that operates in the SWIR spectrum in the range of 1476.83 nm-1478.12 nm. In some implementations, the system may include an external planar imaging system in addition to the silicon photonic switching fabric. The switching fabric was composed of an array of identical ring resonators (1×9), which couple and emit the resonance wavelengths into free space. The scanning angle and angular resolution are directly dependent on the position of the individual waveguide emitters with respect to the optical axis of the imaging system. In addition, the disclosed technology can be implemented in some embodiments to provide a micro-lens array in the imaging system to enhance the fill factor by reducing the blind zones between adjacent emitters. Furthermore, the disclosed technology can be implemented in some embodiments to provide further optimization, and yield higher packing densities, even larger fill factors, scanning ranges, and angular resolution.

Although a few variations have been described in detail above, other modifications or additions are possible. In particular, further features and/or variations may be provided in addition to those set forth herein. Moreover, the example embodiments described above may be directed to various combinations and subcombinations of the disclosed features and/or combinations and subcombinations of several further features disclosed above. In addition, the logic flow depicted in the accompanying figures and/or described herein does not require the particular order shown, or sequential order, to achieve desirable results. Other embodiments may be within the scope of the following claims.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document. It should be noted, that this approach can also include additional components (e.g., modulators, filters, etc.) integrated on the same chip in support of such applications as digital communications, RF photonics, and LIDAR Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

It is intended that the specification, together with the drawings, be considered exemplary only, where exemplary means an example. As used herein, the singular forms "a", "an" and "the" are intended to include the plural forms as well, unless the context clearly indicates otherwise. Additionally, the use of "or" is intended to include "and/or", unless the context clearly indicates otherwise.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is what is described and illustrated, including:

1. A device, comprising:
a plurality of vertically stacked layers including a first layer configured to emit light at a first wavelength and a second layer disposed above the first layer and configured to emit light at a second wavelength different from the first wavelength; and a control circuit coupled to the plurality of vertically stacked layers, wherein each of the plurality of vertically stacked layers includes:

an array of light emitters located at different locations, each light emitter operable to produce an optical beam that is associated with a location of the light emitter and is different from another optical beam produced by another light emitter due to the location of the light emitter being different from a location of another light emitter;

an optical projection device located at a fixed position relative to the array of light emitters in optical paths of the optical beams from the array of light emitters, the optical projection device operable to direct each optical beam to a particular beam direction that is associated with a location of each light emitter relative to the optical projection device and is different from any other beam directions, the optical projection device operable to collect received light, the optical projection device structured to include no moving part; and a plurality of light detectors arranged in rows and columns on the same focal plane as the light emitters and spatially interleaved with the light emitters, the plurality of light detectors configured to detect the received light, wherein transmission of the an optical beam by the array of light emitters and reception of the received light by the plurality of light detectors occur simultaneously, wherein the control circuit is coupled to the array of light emitters and operable to turn on or off the light emitters to project one or more optical beams from the light emitters to the optical projection device which in turn directs the received one or more optical beams to corresponding one or more particular beam directions, wherein the control circuit is operable to selectively turn on and off different laser diodes to project the different optical beams from the selected laser diodes to form a desired beam scanning pattern to effectuate an effect of scanning a single optical beam in different beam directions, wherein the one or more optical beams from the first and second layers are steered independently of or together with each other by the control circuit.

2. The device as in claim 1, wherein:
the array of the light emitters is in a plane; and
the optical projection device includes one or more lenses placed over the plane of the array of light emitters so that different light emitters are at different locations relative to an optical axis of the one or more lenses so that the one or more lenses direct different optical beams from different light emitters in different directions.

3. The device as in claim 2, wherein:
the one or more lenses include a lens array.

4. The device as in claim 1, wherein:
the array of light emitters is an array of laser diodes fixed in position in a plane.

5. The device as in claim 1, wherein:
the array of light emitters includes an array of output waveguide segments formed over a substrate and each output waveguide segment includes an angled facet that directs guided light in each output waveguide segment to the angled facet as an optical beam from a light emitter, a network of waveguides formed over the substrate and coupled to different output waveguide segments to direct light to the different output waveguide segments, coupling between each output waveguide segment to the network of waveguides being controlled by the control circuit to allow the coupling to be turned on and off; and the laser diode is coupled to the network of waveguides to supply laser light to be coupled to the different output waveguide segments so that the different optical beams from the different output waveguide segments are from the laser light of the laser.

6. The device as in claim 5, wherein the laser light is modulated to carry information to be transmitted outside the device.

7. The device as in claim 5, further comprising one or more transmission components for signal collection and processing of collected signals.

8. A beam steering system, comprising:
a plurality of vertically stacked layers including a first layer configured to emit light at a first wavelength and a second layer disposed above the first layer and configured to emit light at a second wavelength different from the first wavelength; and a control circuit coupled to the plurality of vertically stacked layers, wherein each of the plurality of vertically stacked layers includes:

a light emission device including a light source array and a light source selector coupled to the light source array, the light source array including a plurality of light sources arranged in rows and columns, the light source selector being structured to select one or more light sources from the light source array to produce one or more optical beam;

an optical device located at a fixed position relative to the light emission device in optical paths of the one or more optical beams from the light emission device, the optical device operable to collect received light; and a plurality of light detectors arranged in rows and columns on the same focal plane as the plurality of light sources and spatially interleaved with the plurality of light sources, the plurality of light detectors configured to detect the received light, wherein transmission of the one or more optical beams by the plurality of light sources and reception of the received light by the plurality of light detectors occur simultaneously, wherein the control circuit is coupled to the light source selector of the light emission device to select the one or more light sources from the light source array based on address information indicative of the location of the light source associated with the location of incident light on the optical device, wherein the one or more optical beams from the first and second layers are steered independently of or together with each other by the control circuit.

9. The system as in claim 8, wherein the light source selector includes an optical switching fabric formed by a network of waveguides and optical rings optically coupled to each other at different locations associated with the location of incident light on the optical device.

10. The system as in claim 8, wherein the optical device includes a diffractive optical element structured to generated patterns with different diffraction angles depending on the location of incident light on the optical device.

11. The system as in claim 8, wherein the optical device includes a lenslet array including a set of lenslets in the same plane, each lenslet having the same focal length.

12. The system as in claim 8, wherein the optical device includes a lenslet array including a set of lenslets in the same plane, each lenslet having different focal lengths from each other.

13. The system as in claim 8, wherein the light emission device further comprises a plurality of light detectors arranged in rows and columns on the same focal plane as the plurality of light sources.

14. A beam steering system, comprising:
a plurality of vertically stacked layers including a first layer configured to emit light at a first wavelength and a second layer disposed above the first layer and configured to emit light at a second wavelength different from the first wavelength; and
a control circuit coupled to the plurality of vertically stacked layers,
wherein each of the plurality of vertically stacked layers includes:
a light emission device including a plurality of light sources structured to generate a light beam and a light path selector coupled to the plurality of light sources and configured to provide a plurality of light paths to direct the light beam generated by the light source to a desired location;
an optical device located at a fixed position relative to the light emission device in optical paths of one or more optical beams from the light emission device, the optical device operable to collect received light; and
a plurality of light detectors arranged in rows and columns on the same focal plane as the plurality of light sources and spatially interleaved with the plurality of light sources, the plurality of light detectors configured to detect the received light, wherein transmission of the one or more optical beams by the plurality of light sources and reception of the received light by the plurality of light detectors occur simultaneously,
wherein the control circuit is coupled to the light emission device to select one or more of the plurality of light paths based on address information indicative of the location of incident light on the optical device,
wherein the one or more optical beams from the first and second layers are steered independently of or together with each other by the control circuit.

15. The system as in claim 14, wherein the light path selector includes a network of waveguides that distributes the light beam to different locations so that different optical beams can be output at the different locations.

16. The system as in claim 14, wherein the light source includes a laser diode structured to be turned on and off under control of the control circuit.

17. The system as in claim 14, wherein the optical device includes a diffractive optical element structured to generated patterns with different diffraction angles depending on the location of incident light on the optical device.

18. The system as in claim 14, wherein the optical device includes a lenslet array including a set of lenslets in the same plane, each lenslet having the same focal length.

19. The system as in claim 14, wherein the optical device includes a lenslet array including a set of lenslets in the same plane, each lenslet having different focal lengths from each other.

20. The system as in claim 14, wherein the light emission device further comprises a plurality of light detectors arranged in rows and columns on the same focal plane as the plurality of light selectors.

* * * * *